(12) United States Patent
Amin et al.

(10) Patent No.: US 12,275,668 B2
(45) Date of Patent: *Apr. 15, 2025

(54) SCRATCH RESISTANT GLASS AND METHOD OF MAKING

(71) Applicant: CORNING INCORPORATED, Corning, NY (US)

(72) Inventors: Jaymin Amin, Corning, NY (US); Xiaoju Guo, Pittsford, NY (US); Pascale Oram, Painted Post, NY (US); Rostislav Vatchev Roussev, Painted Post, NY (US); Ljerka Ukrainczyk, Ithaca, NY (US); Taylor Marie Wilkinson, Painted Post, NY (US)

(73) Assignee: CORNING INCORPORATED, Corning, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/537,240

(22) Filed: Dec. 12, 2023

(65) Prior Publication Data
US 2024/0109806 A1 Apr. 4, 2024

Related U.S. Application Data

(60) Continuation of application No. 17/894,693, filed on Aug. 24, 2022, now Pat. No. 11,884,581, which is a
(Continued)

(51) Int. Cl.
C03C 21/00 (2006.01)
C03C 3/093 (2006.01)
(Continued)

(52) U.S. Cl.
CPC ............ *C03C 21/002* (2013.01); *C03C 3/093* (2013.01); *C03C 3/125* (2013.01); *C03C 4/18* (2013.01);
(Continued)

(58) Field of Classification Search
None
See application file for complete search history.

(56) References Cited

U.S. PATENT DOCUMENTS 3,433,611 A 3/1969 Saunders et al.
8,312,739 B2 11/2012 Lee et al.
(Continued)

FOREIGN PATENT DOCUMENTS

CN 107265845 A 10/2017
CN 107265884 A 10/2017
(Continued)

OTHER PUBLICATIONS

Chinese Patent Application No. 202080026465.8, Office Action dated Feb. 11, 2023, 4 pages (English Translation only), Chinese Patent Office.
(Continued)

*Primary Examiner* — David Sample
(74) *Attorney, Agent, or Firm* — Payal Patel

(57) ABSTRACT

Methods of manufacturing a glass-based article includes exposing a glass-based substrate having a lithium aluminosilicate composition to an ion exchange treatment to form the glass-based article. The ion exchange treatment including a molten salt bath having a concentration of a sodium salt in a range from 8 mol % to 100 mol %. The glass-based article includes sodium having a non-zero varying concentration extending from a surface of the glass-based article to a depth of the glass-based article The glass-based article has compressive stress layer extending from the surface to a spike depth of layer from 4 micrometers to 8 micrometers. The glass-based article includes a molar ratio of potassium oxide ($K_2O$) to sodium oxide ($Na_2O$) averaged over a distance from the surface to a depth of 0.4 micrometers that is greater than or equal to 0 and less than or equal to 1.8.

19 Claims, 10 Drawing Sheets

Related U.S. Application Data division of application No. 16/826,473, filed on Mar. 23, 2020, now Pat. No. 11,472,733.

(60) Provisional application No. 62/826,300, filed on Mar. 29, 2019.

(51) Int. Cl.
*C03C 3/12* (2006.01)
*C03C 4/18* (2006.01)
*H05K 5/00* (2006.01)
*H05K 5/03* (2006.01)

(52) U.S. Cl.
CPC ............ *H05K 5/0017* (2013.01); *H05K 5/03* (2013.01); *C03C 2204/00* (2013.01); *Y10T 428/315* (2015.01)

(56) References Cited

U.S. PATENT DOCUMENTS

| | | | |
|---|---|---|---|
| 8,561,429 | B2 | 10/2013 | Allan et al. |
| 8,854,623 | B2 | 10/2014 | Fontaine et al. |
| 8,969,226 | B2 | 3/2015 | Dejneka et al. |
| 9,670,088 | B2 | 6/2017 | Gomez et al. |
| 10,633,279 | B2 | 4/2020 | Gross et al. |
| 11,472,733 | B2 * | 10/2022 | Amin ............... C03C 3/125 |
| 2017/0082577 | A1 | 3/2017 | Roussev et al. |
| 2017/0197384 | A1 | 7/2017 | Finkeldey et al. |
| 2017/0291849 | A1 | 10/2017 | Dejneka et al. |
| 2017/0295657 | A1 | 10/2017 | Gross et al. |
| 2017/0305786 | A1 | 10/2017 | Roussev et al. |
| 2019/0016627 | A1 | 1/2019 | Li et al. |
| 2019/0161386 | A1 | 5/2019 | Gross et al. |
| 2020/0055764 | A1 | 2/2020 | Duffy et al. |
| 2020/0148590 | A1 | 5/2020 | Schneider |
| 2020/0148591 | A1 | 5/2020 | Andrews et al. |

FOREIGN PATENT DOCUMENTS

| | | |
|---|---|---|
| CN | 108698922 A | 10/2018 |
| CN | 109071319 A | 12/2018 |
| EP | 0604094 B1 * | 3/1998 |
| TW | 201720779 A | 6/2017 |
| WO | 2018/143991 A1 | 8/2018 |
| WO | 2019/236975 A2 | 12/2019 |
| WO | 2020/009957 A1 | 1/2020 |
| WO | 2020/056006 A1 | 3/2020 |
| WO | 2020/069259 A1 | 4/2020 |
| WO | 2020/069260 A1 | 4/2020 |

OTHER PUBLICATIONS

Gross et al., "Crack-Resistant Glass With High Shear Band Density", Journal of Non-Crystalline Solids 494 (2018): 13-20.

International Search Report and Written Opinion of the International Searching Authority; PCT/US2020/024160; Mailed Jul. 17, 2020; 13 Pages; European Patent Office.

Taiwanese Patent Application No. 109109094, Office Action dated Jun. 4, 2024, 2 pages (English Translation only), Taiwanese Patent Office.

* cited by examiner

SCRATCH RESISTANT GLASS AND METHOD OF MAKING

CROSS-REFERENCE TO RELATED APPLICATIONS

This application is a continuation of U.S. application Ser. No. 17/894,693, filed on Aug. 24, 2022, which is a divisional of U.S. application Ser. No. 16/826,473, filed Mar. 23, 2020, now U.S. Pat. No. 11,472,733, which claims the benefit of U.S. Provisional Application Ser. No. 62/826,300, filed on Mar. 29, 2019, the content of each of which is relied upon and incorporated herein by reference in its entirety.

BACKGROUND

Field

The present specification generally relates to a scratch-resistant glass. More particularly, the specification relates to a method of providing a glass with improved scratch resistance.

Technical Background

Ion exchangeable glasses are widely used as cover glasses and in the bodies of electronic devices. Although ion exchange provides enhanced surface strength to a glass, including improvement in hardness, the glass is still susceptible to scratches caused by exposure to materials that are harder than the glass.

Attempts to improve scratch or abrasion resistance typically include manipulating a composition of the glass itself to increase hardness, use of alternate materials, or applying hard coatings to the glass surface. For example, lithium-based glasses were developed, which improved mechanical performance. The Li-based glasses have been shown to have superior drop performance, which allows for these glasses to be dropped from higher and higher heights before failure (glass breaks/fracture) occurs. In order to improve scratch performance in conjunction with other mechanical performance, boron can be added to open the tightly packed network of the glass.

It has been a continuous effort for glass makers and handheld device manufacturers to improve scratch performance of handheld devices.

Accordingly, a need exists for glasses that can be strengthened, such as by ion exchange, and that have the mechanical properties that allow them to be formed as scratch resistant glass articles.

SUMMARY

Aspects of the disclosure pertain to glass-based articles and methods for their manufacture.

In an aspect, the glass-based article comprises a lithium aluminosilicate composition; sodium having a non-zero varying concentration extending from a surface of the glass-based article to a depth of the glass-based article; a spike depth of layer ($DOL_{spike}$) that is greater than or equal to 4 micrometers and less than or equal to 8 micrometers; and a molar ratio of potassium oxide ($K_2O$) to sodium oxide ($Na_2O$) averaged over a distance from the surface to a depth of 0.4 micrometers that is greater than or equal to 0 and less than or equal to 1.8.

In an aspect, the glass-based article comprises: a lithium aluminosilicate composition; sodium having a non-zero varying concentration extending from a surface of the glass-based article to a depth of the glass-based article; a spike depth of layer ($DOL_{spike}$) that is greater than or equal to 4 micrometers and less than or equal to 8 micrometers; and an average compressive stress ($CS_{avg}$) of greater than or equal to 115 MPa over a depth from 15 micrometers to 40 micrometers.

In an aspect, the glass-based article comprises: sodium having a non-zero varying concentration extending from a surface of the glass-based article to a depth of the glass-based article; an average compressive stress ($CS_{avg}$) of greater than or equal to 150 MPa over a depth from 15 micrometers to 40 micrometers; and a molar ratio of potassium oxide ($K_2O$) to sodium oxide ($Na_2O$) averaged over a distance from the surface to a depth of 0.4 micrometers that is greater than or equal to 0 and less than or equal to 1.8.

In an aspect, a method of manufacturing a glass-based article comprises: exposing a glass-based substrate having opposing first and second surfaces defining a substrate thickness (t) and having a lithium aluminosilicate composition to an ion exchange treatment comprising a molten salt bath having a concentration of a sodium salt in the range of greater than or equal to 8 mol % to less than or equal to 100 mol %; and forming the glass-based article having: sodium having a non-zero varying concentration extending from a surface of the glass-based article to a depth of the glass-based article; a compressive layer extending from the surface to a spike depth of layer ($DOL_{spike}$) that is greater than or equal to 4 micrometers and less than or equal to 8 micrometers; and a molar ratio of potassium oxide ($K_2O$) to sodium oxide ($Na_2O$) averaged over a distance from the surface to a depth of 0.4 micrometers that is greater than or equal to 0 and less than or equal to 1.8.

Additional features and advantages will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

BRIEF DESCRIPTION OF THE DRAWINGS

The accompanying figures, which are incorporated in and constitute a part of this specification, illustrate several embodiments described below.

DETAILED DESCRIPTION

Figure 1:
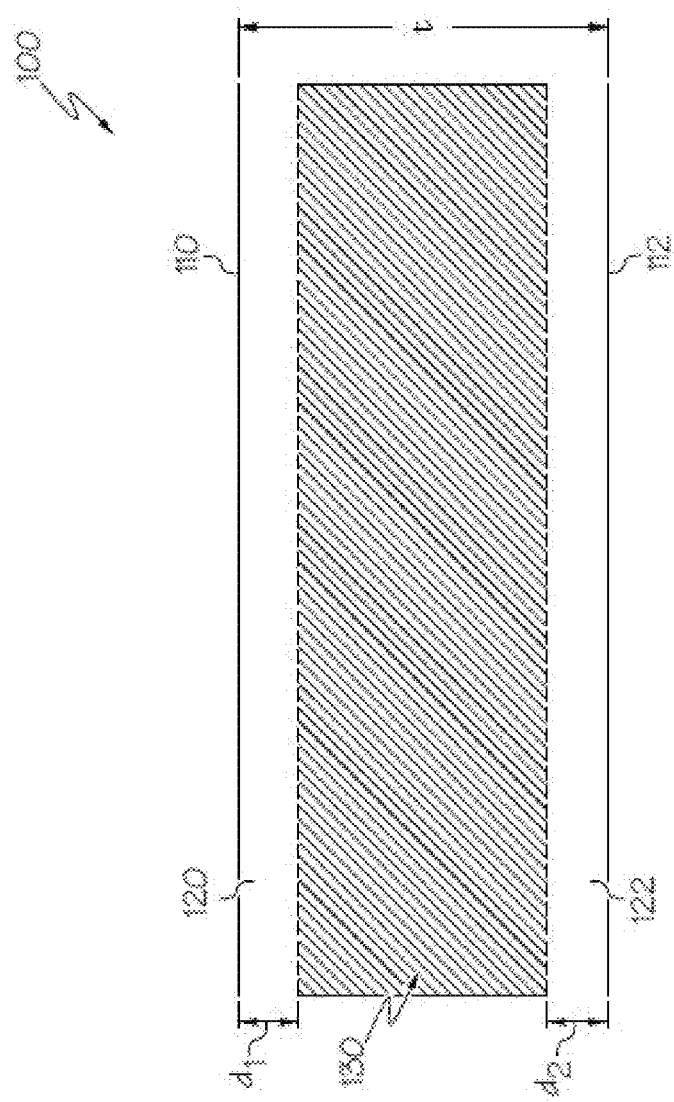
FIG. 1 schematically depicts a cross-section of a glass having compressive stress layers on surfaces thereof according to embodiments disclosed and described herein.

Before describing several exemplary embodiments, it is to be understood that the disclosure is not limited to the details of construction or process steps set forth in the following disclosure. The disclosure provided herein is capable of other embodiments and of being practiced or being carried out in various ways.

Reference throughout this specification to "one embodiment," "certain embodiments," "various embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in various embodiments," "in one embodiment" or "in an embodiment" in various places throughout this specification are not necessarily referring to the same embodiment, or to only one embodiment. Furthermore, the particular features, structures, materials, or characteristics may be combined in any suitable manner in one or more embodiments.

Definitions and Measurement Techniques

The terms "glass-based article" and "glass-based substrates" are used to include any object made wholly or partly of glass. Laminated glass-based articles include laminates of glass and non-glass materials, laminates of glass and crystalline materials. Glass-based substrates according to one or more embodiments can be selected from soda-lime silicate glass, alkali-alumino silicate glass, alkali-containing borosilicate glass, and alkali-containing aluminoborosilicate glass.

A "base composition" is a chemical make-up of a substrate prior to any ion exchange (IOX) treatment. That is, the base composition is undoped by any ions from IOX. A composition at the center of a glass-based article that has been IOX treated is typically the same as the base composition when IOX treatment conditions are such that ions supplied for IOX do not diffuse into the center of the substrate. In one or more embodiments, a central composition at the center of the glass article comprises the base composition.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue. Thus, for example, a glass-based article that is "substantially free of MgO" is one in which MgO is not actively added or batched into the glass-based article, but may be present in very small amounts as a contaminant. As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. When the term "about" is used in describing a value or an end-point of a range, the disclosure should be understood to include the specific value or end-point referred to. Whether or not a numerical value or end-point of a range in the specification recites "about," the numerical value or end-point of a range is intended to include two embodiments: one modified by "about," and one not modified by "about." It will be further understood that the endpoints of each of the ranges are significant both in relation to the other endpoint, and independently of the other endpoint.

Unless otherwise specified, all compositions described herein are expressed in terms of mole percent (mol %) on an oxide basis.

A "stress profile" is stress as a function of thickness across a glass-based article. A compressive stress region extends from a first surface to a depth of compression (DOC) of the article, and is a region where the article is under compressive stress. A central tension region extends from the DOC to include the region where the article is under tensile stress.

As used herein, depth of compression (DOC) refers to the depth at which the stress within the glass-based article changes from compressive to tensile stress. At the DOC, the stress crosses from a positive (compressive) stress to a negative (tensile) stress and thus exhibits a stress value of zero. According to the convention normally used in mechanical arts, compression is expressed as a negative (<0) stress and tension is expressed as a positive (>0) stress. Throughout this description, however, positive values of stress are compressive stress (CS), which are expressed as a positive or absolute value—i.e., as recited herein, CS=|CS|. Additionally, negative values of stress are tensile stress. But when used with the term "tensile", stress or central tension (CT) may be expressed as a positive value, i.e., CT=|CT|. Central tension (CT) refers to tensile stress in a central region or a central tension region of the glass-based article. Maximum central tension (maximum CT or $CT_{max}$) may occur in the central tension region nominally at 0.5·t, where t is the article thickness, which allows for variation from exact center of the location of the maximum tensile stress. Peak tension (PT) refers to maximum tension measured, which may or may not be at the center of the article.

Figure 2:
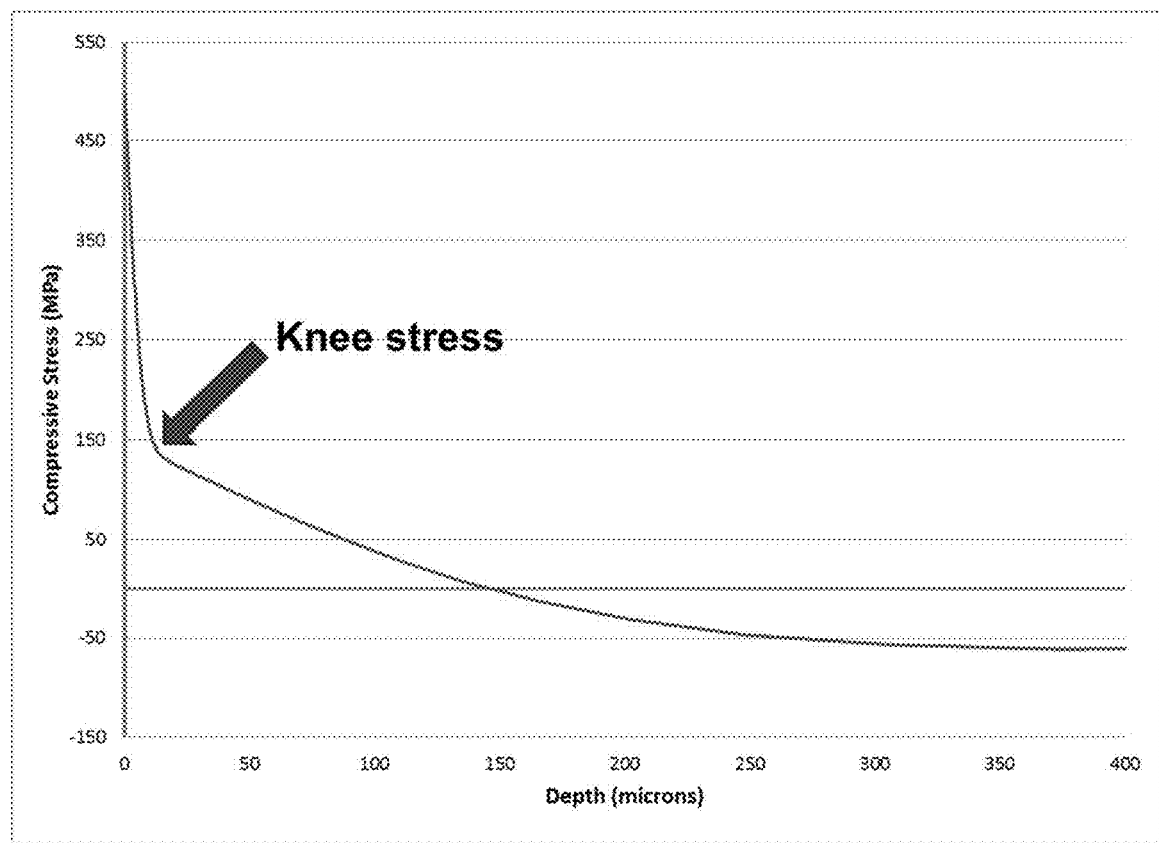
FIG. 2 is a schematic representation of a stress profile including a knee stress.

A "knee" of a stress profile is a depth of an article where the slope of the stress profile transitions from steep to gradual. The knee may refer to a transition area over a span of depths where the slope is changing. The knee stress $CS_k$ is defined as the value of compressive stress that the deeper portion of the CS profile extrapolates to at the depth of spike ($DOL_{sp}$). The $DOL_{sp}$ is reported as measured by a surface-stress meter by known methods. A schematic representation of a stress profile including a knee stress is provided in FIG. 2.

A non-zero metal oxide concentration that varies from the first surface to a depth of layer (DOL) with respect to the metal oxide or that varies along at least a substantial portion of the article thickness (t) indicates that a stress has been generated in the article as a result of ion exchange. The variation in metal oxide concentration may be referred to herein as a metal oxide concentration gradient. The metal oxide that is non-zero in concentration and varies from the first surface to a DOL or along a portion of the thickness may be described as generating a stress in the glass-based article. The concentration gradient or variation of metal oxides is created by chemically strengthening a glass-based substrate in which a plurality of first metal ions in the glass-based substrate is exchanged with a plurality of second metal ions.

As used herein, the terms "depth of exchange", "depth of layer" (DOL), "chemical depth of layer", and "depth of chemical layer" may be used interchangeably, describing in general the depth at which ion exchange facilitated by an ion exchange process (IOX) takes place for a particular ion. DOL refers to the depth within a glass-based article (i.e., the distance from a surface of the glass-based article to its interior region) at which an ion of a metal oxide or alkali metal oxide (e.g., the metal ion or alkali metal ion) diffuses into the glass-based article where the concentration of the ion reaches a minimum value, as determined by Glow Discharge-Optical Emission Spectroscopy (GD-OES)). In some embodiments, the DOL is given as the depth of exchange of the slowest-diffusing or largest ion introduced by an ion exchange (IOX) process. DOL with respect to potassium ($DOL_K$) is the depth at which the potassium content of the glass article reaches the potassium content of the underlying substrate. DOL with respect to sodium ($DOL_{Na}$) is the depth at which the sodium content of the glass article reaches the sodium content of the underlying substrate.

Unless otherwise specified, CT and CS are expressed herein in megaPascals (MPa), thickness is express in millimeters and DOC and DOL are expressed in microns (micrometers).

Compressive stress (including surface/peak CS, $CS_{max}$) and $DOL_{sp}$ are measured by surface stress meter (FSM) using commercially available instruments such as the FSM-6000, manufactured by Orihara Industrial Co., Ltd. (Japan). Surface stress measurements rely upon the accurate measurement of the stress optical coefficient (SOC), which is related to the birefringence of the glass. SOC in turn is measured according to Procedure C (Glass Disc Method) described in ASTM standard C770-16, entitled "Standard Test Method for Measurement of Glass Stress-Optical Coefficient," the contents of which are incorporated herein by reference in their entirety.

The maximum central tension (CT) or peak tension (PT) and stress retention values are measured using a scattered light polariscope (SCALP) technique known in the art. The Refracted near-field (RNF) method or SCALP may be used to measure the stress profile and the depth of compression (DOC). When the RNF method is utilized to measure the stress profile, the maximum CT value provided by SCALP is utilized in the RNF method. In particular, the stress profile measured by RNF is force balanced and calibrated to the maximum CT value provided by a SCALP measurement. The RNF method is described in U.S. Pat. No. 8,854,623, entitled "Systems and methods for measuring a profile characteristic of a glass sample", which is incorporated herein by reference in its entirety. In particular, the RNF method includes placing the glass article adjacent to a reference block, generating a polarization-switched light beam that is switched between orthogonal polarizations at a rate of from 1 Hz to 50 Hz, measuring an amount of power in the polarization-switched light beam and generating a polarization-switched reference signal, wherein the measured amounts of power in each of the orthogonal polarizations are within 50% of each other. The method further includes transmitting the polarization-switched light beam through the glass sample and reference block for different depths into the glass sample, then relaying the transmitted polarization-switched light beam to a signal photodetector using a relay optical system, with the signal photodetector generating a polarization-switched detector signal. The method also includes dividing the detector signal by the reference signal to form a normalized detector signal and determining the profile characteristic of the glass sample from the normalized detector signal.

General Overview of Properties of Glass-Based Articles

Glass-based articles herein have stress profiles that are designed to have improved scratch resistance. Unique stress profiles include a desired potassium-sodium molar ratio at or near a surface of the glass-based article and/or a desired compressive stress at a knee and/or a desired average compressive stress over a certain depth of the article.

During ion exchange, glasses having base compositions where $Na_2O$ mole % is less than $Li_2O$ mole % can experience significant potassium to lithium ion exchange. Although lithium readily ion exchanges for sodium at very fast diffusion rates based on their respective ionic radii sizes, which enables achieving parabolic stress profiles within several hours for lithium glasses, lithium's ion exchange with potassium is much slower due to the ionic radius of potassium being significantly larger than Na. Scratch performance of lithium-based glass compositions with $Na_2O$ mole %<<$Li_2O$ mole % can be improved by using high sodium salt (e.g., $NaNO_3$) concentrations in ion exchange to reduce the amount of potassium to lithium ion exchange. Upon exposure to a treatment bath comprising 100% $NaNO_3$ salt, scratch performance is significantly improved compared to treatment baths containing less than or equal to 10% $NaNO_3$ salt. Also, by using $LiNO_3$ in a treatment bath in combination with greater than or equal to 10% $NaNO_3$ salt, scratch performance is improved while still staying outside of the realm of frangibility. The loads at which lateral cracking appears increase with increasing sodium concentration in the treatment bath. This also relates to the surface of the glass having a similar ratio of mol % concentration of potassium to sodium (or even a higher sodium concentration at the surface).

The methods described herein are advantageous in that by using the specific bath conditions (high sodium concentration), the resulting stress profile results in a glass with improved scratch performance as well as good drop performance. This process allow for increased scratch resistance achieved through a stress profile as opposed to composition changes seen with boron addition. Ultimately, a user may increase or decrease scratch performance of a glass through an ion exchange profile.

Reference will now be made in detail to lithium aluminosilicate glasses and scratch resistance according to various embodiments. Alkali aluminosilicate glasses have good ion exchangeability, and chemical strengthening processes have been used to achieve high strength and high toughness properties in alkali aluminosilicate glasses. Sodium aluminosilicate glasses are highly ion exchangeable glasses with high glass formability and quality. Lithium aluminosilicate glasses are highly ion exchangeable glasses with high glass quality. The substitution of $Al_2O_3$ into the silicate glass network increases the interdiffusivity of monovalent cations during ion exchange. By chemical strengthening in a molten salt bath (e.g., $KNO_3$ or $NaNO_3$), glasses with high strength, high toughness, and high indentation cracking resistance can be achieved. The stress profiles achieved through chemical strengthening may have a variety of shapes that increase the drop performance, strength, toughness, and other attributes of the glass articles as well as improved scratch resistance.

Therefore, lithium aluminosilicate glasses with good physical properties, chemical durability, and ion exchangeability have drawn attention for use as cover glass. Through different ion exchange processes, greater central tension (CT), depth of compression (DOC), and high compressive stress (CS) can be achieved. The stress profiles described herein provide increased fracture resistance for lithium containing glass articles.

In embodiments of glass compositions described herein, the concentration of constituent components (e.g., $SiO_2$, $Al_2O_3$, $Li_2O$, and the like) are given in mole percent (mol %) on an oxide basis, unless otherwise specified. It should be understood that any of the variously recited ranges of one component may be individually combined with any of the variously recited ranges for any other component.

Disclosed herein are ion exchange methods and stress profiles for lithium aluminosilicate glass compositions. The stress profiles exhibit scratch resistance. With reference to FIG. 1, the glass has a thickness t and a first region under compressive stress (e.g., first and second compressive stress layers 120, 122 in FIG. 1) extending from the surface to a depth of compression (DOC) of the glass and a second region (e.g., central region 130 in FIG. 1) under a tensile stress or central tension (CT) extending from the DOC into the central or interior region of the glass.

The compressive stress (CS) has a maximum or peak value, which typically occurs at the surface of the glass (but such need not be the case as the peak may occur at a depth from the surface of the glass), and the CS varies with distance d from the surface according to a function. Referring again to FIG. 1, the first compressive stress layer 120 extends from first surface 110 to a depth $d_1$ and a second compressive stress layer 122 extends from second surface 112 to a depth $d_2$. Together, these segments define a compression or CS of glass 100.

The compressive stress of both major surfaces (110, 112 in FIG. 1) is balanced by stored tension in the central region (130) of the glass.

In the glass-based articles, there is an alkali metal oxide having a non-zero concentration that varies from one or both of first and second surfaces to a depth of layer (DOL) with respect to the metal oxide. A stress profile is generated due to the non-zero concentration of the metal oxide(s) that varies from the first surface. The non-zero concentration may vary along a portion of the article thickness. In some embodiments, the concentration of the alkali metal oxide is non-zero and varies, both along a thickness range from about 0·t to about 0.3·t. In some embodiments, the concentration of the alkali metal oxide is non-zero and varies along a thickness range from about 0·t to about 0.35·t, from about 0·t to about 0.4·t, from about 0·t to about 0.45·t, from about 0·t to about 0.48·t, or from about 0·t to about 0.50·t. The variation in concentration may be continuous along the above-referenced thickness ranges. Variation in concentration may include a change in metal oxide concentration of about 0.2 mol % or more along a thickness segment of about 100 micrometers. The change in metal oxide concentration may be about 0.3 mol % or more, about 0.4 mol % or more, or about 0.5 mol % or more along a thickness segment of about 100 micrometers. This change may be measured by known methods in the art including microprobe.

In some embodiments, the variation in concentration may be continuous along thickness segments in the range from about 10 micrometers to about 30 micrometers. In some embodiments, the concentration of the alkali metal oxide decreases from the first surface to a value between the first surface and the second surface and increases from the value to the second surface.

The concentration of alkali metal oxide may include more than one metal oxide (e.g., a combination of $Na_2O$ and $K_2O$). In some embodiments, where two metal oxides are utilized and where the radius of the ions differ from one or another, the concentration of ions having a larger radius is greater than the concentration of ions having a smaller radius at shallow depths, while at deeper depths, the concentration of ions having a smaller radius is greater than the concentration of ions having larger radius.

In one or more embodiments, the alkali metal oxide concentration gradient extends through a substantial portion of the thickness t of the article. In some embodiments, the concentration of the metal oxide may be about 0.5 mol % or greater (e.g., about 1 mol % or greater) along the entire thickness of the first and/or second section, and is greatest at a first surface and/or a second surface 0·t and decreases substantially constantly to a value between the first and second surfaces. At that value, the concentration of the metal oxide is the least along the entire thickness t; however the concentration is also non-zero at that point. In other words, the non-zero concentration of that particular metal oxide extends along a substantial portion of the thickness t (as described herein) or the entire thickness t. The total concentration of the particular metal oxide in the glass-based article may be in the range from about 1 mol % to about 20 mol %.

The concentration of the alkali metal oxide may be determined from a baseline amount of the metal oxide in the glass-based substrate ion exchanged to form the glass-based article.

In one or more embodiments, the glass-based article comprises: a molar ratio of potassium oxide ($K_2O$) to sodium oxide ($Na_2O$) averaged over a distance from the surface to a depth of 0.4 micrometers that is greater than or equal to 0 and less than or equal to 1.8, or greater than or equal to 0.2, greater than or equal to 0.4, greater than or equal to 0.6; greater than or equal to 0.8, greater than or equal to 1, greater than or equal to 1.2, greater than or equal to 1.4, greater than or equal to 1.6; and/or less than or equal to 1.7; less than or equal to 1.5; less than or equal to 1.3; less than or equal to 1.1; less than or equal to 0.9; and all values and subranges therebetween. These $K_2O$ to $Na_2O$ molar ratios contribute, at least in part, to the improved scratch resistance of the glass-based articles described herein.

In one or more embodiments, the glass-based article comprises: a spike depth of layer ($DOL_{spike}$) that is greater than or equal to 4 micrometers, greater than or equal to 4.5 micrometers, greater than or equal to 5 micrometers, greater than or equal to 5.5 micrometers, greater than or equal to 6 micrometers, greater than or equal to 6.5 micrometers, greater than or equal to 7 micrometers; and/or less than or equal to 8 micrometers, less than or equal to 7.5 micrometers, less than or equal to 7 micrometers, including all values and subranges therebetween.

In one or more embodiments, the glass-based article comprises: a potassium depth of layer ($DOL_K$) that is greater than or equal to 4 micrometers, greater than or equal to 4.5 micrometers, greater than or equal to 5 micrometers, greater than or equal to 5.5 micrometers, greater than or equal to 6 micrometers, greater than or equal to 6.5 micrometers, greater than or equal to 7 micrometers; and/or less than or equal to 8 micrometers, less than or equal to 7.5 micrometers, less than or equal to 7 micrometers, including all values and subranges therebetween.

In one or more embodiments, the glass-based article comprises: sodium a non-zero varying concentration extending from a surface of the glass-based article to a depth ($DOL_{Na}$) that is greater than or equal to 4 micrometers, greater than or equal to 4.5 micrometers, greater than or equal to 5 micrometers, greater than or equal to 5.5 micrometers, greater than or equal to 6 micrometers, greater than or equal to 6.5 micrometers, greater than or equal to 7 micrometers; and/or less than or equal to 8 micrometers, less than or equal to 7.5 micrometers, less than or equal to 7 micrometers, including all values and subranges therebetween.

In one or more embodiments, the glass-based article comprises: an average compressive stress ($CS_{avg}$) over a depth from 15 micrometers to 40 micrometers of greater than or equal to 115 MPa, greater than or equal to 120 MPa, greater than or equal to 125 MPa, greater than or equal to 130 MPa, greater than or equal to 135 MPa, greater than or equal to 140 MPa, greater than or equal to 145 MPa, greater than or equal to 150 MPa, greater than or equal to 155 MPa, greater than or equal to 160 MPa, greater than or equal to 165 MPa, greater than or equal to 170 MPa, including all values and subranges therebetween.

In one or more embodiments, the glass-based article comprises: a compressive stress at a knee ($CS_k$) that is greater than or equal to 115 MPa, greater than or equal to 120 MPa, greater than or equal to 125 MPa, greater than or equal to 130 MPa, greater than or equal to 135 MPa, greater than or equal to 140 MPa, greater than or equal to 145 MPa, greater than or equal to 150 MPa, greater than or equal to 155 MPa, greater than or equal to 160 MPa, greater than or equal to 165 MPa, greater than or equal to 170 MPa, including all values and subranges therebetween.

In one or more embodiments, the glass-based article comprises: a compressive stress at a knee ($CS_k$) that is greater than or equal to 115 MPa, greater than or equal to 120 MPa, greater than or equal to 125 MPa, greater than or equal to 130 MPa, greater than or equal to 135 MPa, greater than or equal to 140 MPa, greater than or equal to 145 MPa, greater than or equal to 150 MPa, greater than or equal to 155 MPa, greater than or equal to 160 MPa, greater than or equal to 165 MPa, greater than or equal to 170 MPa, including all values and subranges therebetween.

In one or more embodiments, the glass-based article comprises: a depth of compression (DOC) that is greater than or equal to 0.19 t, greater than or equal to 0.20 t, greater than or equal to 0.21 t, greater than or equal to 0.22 t, greater than or equal to 0.23 t, greater than or equal to 0.24 t, greater than or equal to 0.25 t, and/or less than or equal to 0.30 t, less than or equal to 0.29 t, less than or equal to 0.28 t, less than or equal to 0.27 t, less than or equal to 0.26 t, less than or equal to 0.25 t, less than or equal to 0.24 t, less than or equal to 0.23 t, including all values and subranges therebetween.

In one or more embodiments, the glass-based article comprises: a depth of compression (DOC) that is greater than or equal to 150 micrometers, greater than or equal to 155 micrometers, greater than or equal to 160 micrometers, greater than or equal to 165 micrometers, greater than or equal to 170 micrometers, including all values and subranges therebetween.

In one or more embodiments, the glass-based article comprises: t in the range of 0.5 mm to 0.8 mm, and all values and subranges therebetween; and/or t may be 0.8 mm or less, 0.75 mm or less, 0.73 mm or less, 0.70 mm or less, 0.65 mm or less, 0.6 mm or less, 0.55 mm or less, 0.4 mm or less, 0.3 mm or less, or 0.2 mm or less and/or greater than or equal to 0.1 mm, including all values and subranges therebetween.

In one or more embodiments, the glass-based article comprises: a maximum compressive stress ($CS_{max}$) that is greater than or equal to 500 MPa, greater than or equal to 550 MPa, greater than or equal to 600 MPa, greater than or equal to 650 MPa, greater than or equal to 700 MPa, greater than or equal to 750 MPa, greater than or equal to 800 MPa, greater than or equal to 850 MPa, greater than or equal to 900 MPa, greater than or equal to 950 MPa, greater than or equal to 1000 MPa, greater than or equal to 1050 MPa, greater than or equal to 1100 MPa, greater than or equal to 1150 MPa, or greater than or equal to 1200 MPa, including all values and subranges therebetween.

In one or more embodiments, the glass-based article comprises: a $Li_2O/Na_2O$ molar ratio that is greater than or equal to 0.10 and less than or equal to 0.63, including all values and subranges therebetween.

In combination with the molar ratio of potassium oxide ($K_2O$) to sodium oxide ($Na_2O$) averaged over a distance from the surface to a depth of 0.4 micrometers that is greater than or equal to 0 and less than or equal to 1.8, the glass-based articles may possess one or a combination of the following features: a lithium aluminosilicate composition; sodium having a non-zero varying concentration extending from a surface of the glass-based article to a depth of the glass-based article; a spike depth of layer ($DOL_{spike}$) that is greater than or equal to 4 micrometers, greater than or equal to 4.5 micrometers, greater than or equal to 5 micrometers, greater than or equal to 5.5 micrometers, greater than or equal to 6 micrometers, greater than or equal to 6.5 micrometers, greater than or equal to 7 micrometers; and/or less than or equal to 8 micrometers, less than or equal to 7.5 micrometers, less than or equal to 7 micrometers, including all values and subranges therebetween; an average compressive stress ($CS_{avg}$) over a depth from 15 micrometers to 40 micrometers of greater than or equal to 115 MPa, greater than or equal to 120 MPa, greater than or equal to 125 MPa, greater than or equal to 130 MPa, greater than or equal to 135 MPa, greater than or equal to 140 MPa, greater than or equal to 145 MPa, greater than or equal to 150 MPa, greater than or equal to 155 MPa, greater than or equal to 160 MPa, greater than or equal to 165 MPa, greater than or equal to 170 MPa, including all values and subranges therebetween; a compressive stress at a knee ($CS_k$) that is greater than or equal to 115 MPa, greater than or equal to 120 MPa, greater than or equal to 125 MPa, greater than or equal to 130 MPa, greater than or equal to 135 MPa, greater than or equal to 140 MPa, greater than or equal to 145 MPa, greater than or equal to 150 MPa, greater than or equal to 155 MPa, greater than or equal to 160 MPa, greater than or equal to 165 MPa, greater than or equal to 170 MPa, including all values and subranges therebetween; a depth of compression (DOC) that is greater than or equal to 0.19 t, greater than or equal to 0.20 t, greater than or equal to 0.21 t, greater than or equal to 0.22 t, greater than or equal to 0.23 t, greater than or equal to 0.24 t, greater than or equal to 0.25 t, and/or less than or equal to 0.30 t, less than or equal to 0.29 t, less than or equal to 0.28 t, less than or equal to 0.27 t, less than or equal to 0.26 t, less than or equal to 0.25 t, less than or equal to 0.24 t, less than or equal to 0.23 t, including all values and subranges therebetween, and/or that is greater than or equal to 150 micrometers, greater than or equal to 155 micrometers, greater than or equal to 160 micrometers, greater than or equal to 165 micrometers, greater than or equal to 170 micrometers, including all values and subranges therebetween; t in the range of 0.5 mm to 0.8 mm, and all values and subranges therebetween; and/or t may be 0.8 mm or less, 0.75 mm or less, 0.73 mm or less, 0.70 mm or less, 0.65 mm or less, 0.6 mm or less, 0.55 mm or less, 0.4 mm or less, 0.3 mm or less, or 0.2 mm or less and/or greater than or equal to 0.1 mm; a maximum compressive stress ($CS_{max}$) that is greater than or equal to 500 MPa, greater than or equal to 550 MPa, greater than or equal to 600 MPa, greater than or equal to 650 MPa, greater than or equal to 700 MPa, greater than or equal to 750 MPa, greater than or equal to 800 MPa, greater than or equal to 850 MPa, greater than or equal to 900 MPa, greater than or equal to 950 MPa, greater than or equal to 1000 MPa, greater than or equal to 1050 MPa, greater than or equal to 1100 MPa, greater than or equal to 1150 MPa, or greater than or equal to 1200 MPa, including all values and subranges therebetween; a $Li_2O/Na_2O$ molar ratio that is greater than or equal to 0.10 and less than or equal to 0.63, including all values and subranges therebetween; and at the center of the glass-based article, a base composition comprises: 9.39-25 mol % alumina ($Al_2O_3$), 0.1-20 mol % sodium oxide ($Na_2O$), and up to 9.01 mol % boron oxide ($B_2O_3$), and at least one alkaline earth metal oxide, wherein 15 mol %≤($R_2O+R'O—Al_2O_3—ZrO_2$)—$B_2O_3$≤2 mol %, where R is Na and optionally one or more of Li, K, Rb, and Cs, and R' is one or more of Mg, Ca, Sr, and Ba.

In combination with a spike depth of layer ($DOL_{spike}$) that is greater than or equal to 4 micrometers, greater than or equal to 4.5 micrometers, greater than or equal to 5 micrometers, greater than or equal to 5.5 micrometers, greater than or equal to 6 micrometers, greater than or equal to 6.5 micrometers, greater than or equal to 7 micrometers; and/or less than or equal to 8 micrometers, less than or equal to 7.5 micrometers, less than or equal to 7 micrometers, including all values and subranges therebetween, the glass-based articles may possess one or a combination of the following features: a lithium aluminosilicate composition; sodium having a non-zero varying concentration extending from a surface of the glass-based article to a depth of the glass-based article; molar ratio of potassium oxide ($K_2O$) to sodium oxide ($Na_2O$) averaged over a distance from the surface to a depth of 0.4 micrometers that is greater than or equal to 0 and less than or equal to 1.8; an average compressive stress ($CS_{avg}$) over a depth from 15 micrometers to 40 micrometers of greater than or equal to 115 MPa, greater than or equal to 120 MPa, greater than or equal to 125 MPa, greater than or equal to 130 MPa, greater than or equal to 135 MPa, greater than or equal to 140 MPa, greater than or equal to 145 MPa, greater than or equal to 150 MPa, greater than or equal to 155 MPa, greater than or equal to 160 MPa, greater than or equal to 165 MPa, greater than or equal to 170 MPa, including all values and subranges therebetween; a compressive stress at a knee ($CS_k$) that is greater than or equal to 115 MPa, greater than or equal to 120 MPa, greater than or equal to 125 MPa, greater than or equal to 130 MPa, greater than or equal to 135 MPa, greater than or equal to 140 MPa, greater than or equal to 145 MPa, greater than or equal to 150 MPa, greater than or equal to 155 MPa, greater than or equal to 160 MPa, greater than or equal to 165 MPa, greater than or equal to 170 MPa, including all values and subranges therebetween; a depth of compression (DOC) that is greater than or equal to 0.19 t, greater than or equal to 0.20 t, greater than or equal to 0.21 t, greater than or equal to 0.22 t, greater than or equal to 0.23 t, greater than or equal to 0.24 t, greater than or equal to 0.25 t, and/or less than or equal to 0.30 t, less than or equal to 0.29 t, less than or equal to 0.28 t, less than or equal to 0.27 t, less than or equal to 0.26 t, less than or equal to 0.25 t, less than or equal to 0.24 t, less than or equal to 0.23 t, including all values and subranges therebetween, and/or that is greater than or equal to 150 micrometers, greater than or equal to 155 micrometers, greater than or equal to 160 micrometers, greater than or equal to 165 micrometers, greater than or equal to 170 micrometers, including all values and subranges therebetween; t in the range of 0.5 mm to 0.8 mm, and all values and subranges therebetween; and/or t may be 0.8 mm or less, 0.75 mm or less, 0.73 mm or less, 0.70 mm or less, 0.65 mm or less, 0.6 mm or less, 0.55 mm or less, 0.4 mm or less, 0.3 mm or less, or 0.2 mm or less and/or greater than or equal to 0.1 mm; a maximum compressive stress ($CS_{max}$) that is greater than or equal to 500 MPa, greater than or equal to 550 MPa, greater than or equal to 600 MPa, greater than or equal to 650 MPa, greater than or equal to 700 MPa, greater than or equal to 750 MPa, greater than or equal to 800 MPa, greater than or equal to 850 MPa, greater than or equal to 900 MPa, greater than or equal to 950 MPa, greater than or equal to 1000 MPa, greater than or equal to 1050 MPa, greater than or equal to 1100 MPa, greater than or equal to 1150 MPa, or greater than or equal to 1200 MPa, including all values and subranges therebetween; a $Li_2O/Na_2O$ molar ratio that is greater than or equal to 0.10 and less than or equal to 0.63, including all values and subranges therebetween; and at the center of the glass-based article, a base composition comprises: 9.39-25 mol % alumina ($Al_2O_3$), 0.1-20 mol % sodium oxide ($Na_2O$), and up to 9.01 mol % boron oxide ($B_2O_3$), and at least one alkaline earth metal oxide, wherein 15 mol %≤($R_2O+R'O—Al_2O_3—ZrO_2$)—$B_2O_3$≤2 mol %, where R is Na and optionally one or more of Li, K, Rb, and Cs, and R' is one or more of Mg, Ca, Sr, and Ba.

In combination with an average compressive stress ($CS_{avg}$) over a depth from 15 micrometers to 40 micrometers of greater than or equal to 115 MPa, greater than or equal to 120 MPa, greater than or equal to 125 MPa, greater than or equal to 130 MPa, greater than or equal to 135 MPa, greater than or equal to 140 MPa, greater than or equal to 145 MPa, greater than or equal to 150 MPa, greater than or equal to 155 MPa, greater than or equal to 160 MPa, greater than or equal to 165 MPa, greater than or equal to 170 MPa, including all values and subranges therebetween, the glass-based articles may possess one or a combination of the following features: a lithium aluminosilicate composition; sodium having a non-zero varying concentration extending from a surface of the glass-based article to a depth of the glass-based article; molar ratio of potassium oxide ($K_2O$) to sodium oxide ($Na_2O$) averaged over a distance from the surface to a depth of 0.4 micrometers that is greater than or equal to 0 and less than or equal to 1.8; a spike depth of layer ($DOL_{spike}$) that is greater than or equal to 4 micrometers, greater than or equal to 4.5 micrometers, greater than or equal to 5 micrometers, greater than or equal to 5.5 micrometers, greater than or equal to 6 micrometers, greater than or equal to 6.5 micrometers, greater than or equal to 7 micrometers; and/or less than or equal to 8 micrometers, less than or equal to 7.5 micrometers, less than or equal to 7 micrometers, including all values and subranges therebetween; a compressive stress at a knee ($CS_k$) that is greater than or equal to 115 MPa, greater than or equal to 120 MPa, greater than or equal to 125 MPa, greater than or equal to 130 MPa, greater than or equal to 135 MPa, greater than or equal to 140 MPa, greater than or equal to 145 MPa, greater than or equal to 150 MPa, greater than or equal to 155 MPa, greater than or equal to 160 MPa, greater than or equal to 165 MPa, greater than or equal to 170 MPa, including all values and subranges therebetween; a depth of compression (DOC) that is greater than or equal to 0.19 t, greater than or equal to 0.20 t, greater than or equal to 0.21 t, greater than or equal to 0.22 t, greater than or equal to 0.23 t, greater than or equal to 0.24 t, greater than or equal to 0.25 t, and/or less than or equal to 0.30 t, less than or equal to 0.29 t, less than or equal to 0.28 t, less than or equal to 0.27 t, less than or equal to 0.26 t, less than or equal to 0.25 t, less than or equal to 0.24 t, less than or equal to 0.23 t, including all values and subranges therebetween, and/or that is greater than or equal to 150 micrometers, greater than or equal to 155 micrometers, greater than or equal to 160 micrometers, greater than or equal to 165 micrometers, greater than or equal to 170 micrometers, including all values and subranges therebetween; t in the range of 0.5 mm to 0.8 mm, and all values and subranges therebetween; and/or t may be 0.8 mm or less, 0.75 mm or less, 0.73 mm or less, 0.70 mm or less, 0.65 mm or less, 0.6 mm or less, 0.55 mm or less, 0.4 mm or less, 0.3 mm or less, or 0.2 mm or less and/or greater than or equal to 0.1 mm; a maximum compressive stress ($CS_{max}$) that is greater than or equal to 500 MPa, greater than or equal to 550 MPa, greater than or equal to 600 MPa, greater than or equal to 650 MPa, greater than or equal to 700 MPa, greater than or equal to 750 MPa, greater than or equal to 800 MPa, greater than or equal to 850 MPa, greater than or equal to 900 MPa, greater than or equal to 950 MPa, greater than or equal to 1000 MPa, greater than or equal to 1050 MPa, greater than or equal to 1100 MPa, greater than or equal to 1150 MPa, or greater than or equal to 1200 MPa, including all values and subranges therebetween; a $Li_2O/Na_2O$ molar ratio that is greater than or equal to 0.10 and less than or equal to 0.63, including all values and subranges therebetween; and at the center of the glass-based article, a base composition comprises: 9.39-25 mol % alumina ($Al_2O_3$), 0.1-20 mol % sodium oxide ($Na_2O$), and up to 9.01 mol % boron oxide ($B_2O_3$), and at least one alkaline earth metal oxide, wherein 15 mol %≤($R_2O+R'O-Al_2O_3-ZrO_2$)−$B_2O_3$≤2 mol %, where R is Na and optionally one or more of Li, K, Rb, and Cs, and R' is one or more of Mg, Ca, Sr, and Ba.

In an aspect, the glass-based article comprises a lithium aluminosilicate composition; sodium having a non-zero varying concentration extending from a surface of the glass-based article to a depth of the glass-based article; a spike depth of layer ($DOL_{spike}$) that is greater than or equal to 4 micrometers and less than or equal to 8 micrometers; and a molar ratio of potassium oxide ($K_2O$) to sodium oxide ($Na_2O$) averaged over a distance from the surface to a depth of 0.4 micrometers that is greater than or equal to 0 and less than or equal to 1.8.

In an aspect, the glass-based article comprises: a lithium aluminosilicate composition; sodium having a non-zero varying concentration extending from a surface of the glass-based article to a depth of the glass-based article; a spike depth of layer ($DOL_{spike}$) that is greater than or equal to 4 micrometers and less than or equal to 8 micrometers; and an average compressive stress ($CS_{avg}$) of greater than or equal to 115 MPa over a depth from 15 micrometers to 40 micrometers.

In an aspect, the glass-based article comprises: sodium having a non-zero varying concentration extending from a surface of the glass-based article to a depth of the glass-based article; an average compressive stress ($CS_{avg}$) of greater than or equal to 150 MPa over a depth from 15 micrometers to 40 micrometers; and a molar ratio of potassium oxide ($K_2O$) to sodium oxide ($Na_2O$) averaged over a distance from the surface to a depth of 0.4 micrometers that is greater than or equal to 0 and less than or equal to 1.8.

Glass-Based Substrates

Examples of glasses that may be used as substrates may include alkali-alumino silicate glass compositions or alkali-containing aluminoborosilicate glass compositions, though other glass compositions are contemplated. Specific examples of glass-based substrates that may be used include but are not limited to an alkali-alumino silicate glass, an alkali-containing borosilicate glass, an alkali-alumino borosilicate glass, an alkali-containing lithium alumino silicate glass, or an alkali-containing phosphate glass. The glass-based substrates have base compositions that may be characterized as ion exchangeable. As used herein, "ion exchangeable" means that a substrate comprising the composition is capable of exchanging cations located at or near the surface of the substrate with cations of the same valence that are either larger or smaller in size.

In one or more embodiments, glass-based substrates may include a lithium-containing aluminosilicate.

In embodiments, the glass-based substrates may be formed from any composition capable of forming the stress profiles. In some embodiments, the glass-based substrates may be formed from the glass compositions described in U.S. application Ser. No. 16/202,691 titled "Glasses with Low Excess Modifier Content," filed Nov. 28, 2018, the entirety of which is incorporated herein by reference. In some embodiments, the glass articles may be formed from the glass compositions described in U.S. application Ser. No. 16/202,767 titled "Ion-Exchangeable Mixed Alkali Aluminosilicate Glasses," filed Nov. 28, 2018, the entirety of which is incorporated herein by reference.

The glass-based substrates may be characterized by the manner in which it may be formed. For instance, the glass-based substrates may be characterized as float-formable (i.e., formed by a float process), down-drawable and, in particular, fusion-formable or slot-drawable (i.e., formed by a down draw process such as a fusion draw process or a slot draw process). In embodiments, the glass-based substrates may be roll formed.

Some embodiments of the glass-based substrates described herein may be formed by a down-draw process. Down-draw processes produce glass-based substrates having a uniform thickness that possess relatively pristine surfaces. Because the average flexural strength of the glass article is controlled by the amount and size of surface flaws, a pristine surface that has had minimal contact has a higher initial strength. In addition, down drawn glass articles have a very flat, smooth surface that can be used in its final application without costly grinding and polishing.

Some embodiments of the glass-based substrates may be described as fusion-formable (i.e., formable using a fusion draw process). The fusion process uses a drawing tank that has a channel for accepting molten glass raw material. The channel has weirs that are open at the top along the length of the channel on both sides of the channel. When the channel fills with molten material, the molten glass overflows the weirs. Due to gravity, the molten glass flows down the outside surfaces of the drawing tank as two flowing glass films. These outside surfaces of the drawing tank extend down and inwardly so that they join at an edge below the drawing tank. The two flowing glass films join at this edge to fuse and form a single flowing glass article. The fusion draw method offers the advantage that, because the two glass films flowing over the channel fuse together, neither of the outside surfaces of the resulting glass article comes in contact with any part of the apparatus. Thus, the surface properties of the fusion drawn glass article are not affected by such contact.

Some embodiments of the glass-based substrates described herein may be formed by a slot draw process. The slot draw process is distinct from the fusion draw method. In slot draw processes, the molten raw material glass is provided to a drawing tank. The bottom of the drawing tank has an open slot with a nozzle that extends the length of the slot. The molten glass flows through the slot/nozzle and is drawn downward as a continuous glass article and into an annealing region.

In an embodiment, a base composition comprises: 9.39-25 mol % alumina ($Al_2O_3$), 0.1-20 mol % sodium oxide ($Na_2O$), and up to 9.01 mol % boron oxide ($B_2O_3$), and at least one alkaline earth metal oxide, wherein 15 mol %≤($R_2O+R'O—Al_2O_3—ZrO_2$)—$B_2O_3$≤2 mol %, where R is Na and optionally one or more of Li, K, Rb, and Cs, and R' is one or more of Mg, Ca, Sr, and Ba.

In one or more embodiments, the glass-based substrates described herein may exhibit an amorphous microstructure and may be substantially free of crystals or crystallites. In other words, the glass-base substrates articles exclude glass-ceramic materials in some embodiments.

Ion Exchange (IOX) Treatment

Chemical strengthening of glass substrates having base compositions is done by placing the ion-exchangeable glass substrates in a molten bath containing cations (e.g., K+, Na+, Ag+, etc) that diffuse into the glass while the smaller alkali ions (e.g., Na+, Li+) of the glass diffuse out into the molten bath. The replacement of the smaller cations by larger ones creates compressive stresses near the top surface of glass. Tensile stresses are generated in the interior of the glass to balance the near-surface compressive stresses.

With respect to ion exchange processes, they may independently be a thermal-diffusion process or an electro-diffusion process. Non-limiting examples of ion exchange processes in which glass is immersed in multiple ion exchange baths, with washing and/or annealing steps between immersions, are described in U.S. Pat. No. 8,561,429, by Douglas C. Allan et al., issued on Oct. 22, 2013, entitled "Glass with Compressive Surface for Consumer Applications," and claiming priority from U.S. Provisional Patent Application No. 61/079,995, filed Jul. 11, 2008, in which glass is strengthened by immersion in multiple, successive, ion exchange treatments in salt baths of different concentrations; and U.S. Pat. No. 8,312,739, by Christopher M. Lee et al., issued on Nov. 20, 2012, and entitled "Dual Stage Ion Exchange for Chemical Strengthening of Glass," and claiming priority from U.S. Provisional Patent Application No. 61/084,398, filed Jul. 29, 2008, in which glass is strengthened by ion exchange in a first bath is diluted with an effluent ion, followed by immersion in a second bath having a smaller concentration of the effluent ion than the first bath. The contents of U.S. Pat. Nos. 8,561,429 and 8,312,739 are incorporated herein by reference in their entireties.

After an ion exchange process is performed, it should be understood that a composition at the surface of a glass article may be different than the composition of the as-formed glass article (i.e., the glass article before it undergoes an ion exchange process). This results from one type of alkali metal ion in the as-formed glass, such as, for example $Li^+$ or $Na^+$, being replaced with larger alkali metal ions, such as, for example $Na^+$ or $K^+$, respectively. However, the glass composition at or near the center of the depth of the glass article will, in embodiments, still have the composition of the as-formed glass article.

In an aspect, a method of manufacturing a glass-based article comprises: exposing a glass-based substrate having opposing first and second surfaces defining a substrate thickness (t) and having a lithium aluminosilicate composition to an ion exchange treatment comprising a molten salt bath having a concentration of a sodium salt in the range of greater than or equal to 8 mol % to less than or equal to 100 mol %; and forming the glass-based article having: sodium having a non-zero varying concentration extending from a surface of the glass-based article to a depth of the glass-based article; a compressive layer extending from the surface to a spike depth of layer ($DOL_{spike}$) that is greater than or equal to 4 micrometers and less than or equal to 8 micrometers; and a molar ratio of potassium oxide ($K_2O$) to sodium oxide ($Na_2O$) averaged over a distance from the surface to a depth of 0.4 micrometers that is greater than or equal to 0 and less than or equal to 1.8.

The glass-based article made by the methods herein may comprise one or more of the following: an average compressive stress ($CS_{avg}$) of greater than or equal to 115 MPa over a depth from 15 micrometers to 40 micrometers; and a depth of compression (DOC) that is greater than or equal to 0.19 t and/or greater than or equal to 150 micrometers. A base composition of the glass-based substrate comprises a molar ratio of sodium oxide ($Na_2O$) to lithium oxide ($Li_2O$) of less than or equal to 0.63. The sodium salt may comprise: $NaNO_3$, $Na_2CO_3$, $Na_3PO_4$, $Na_2SO_4$, $Na_3BO_3$, NaCl, or combinations thereof.

In an embodiment, the method is conducted using a single ion exchange treatment, wherein the molten salt bath comprises the sodium salt in an amount of greater than or equal to 8 weight % and less than or equal to 100 weight %, a lithium salt in an amount of greater than or equal to 0 weight % and less than or equal to 10 weight %, and a potassium salt in an amount of greater than or equal to 0 weight % and less than or equal to 90 weight %. The sodium salt may comprise sodium nitrate ($NaNO_3$), the lithium salt comprises lithium nitrate ($LiNO_3$), and the potassium salt comprises potassium nitrate ($KNO_3$).

In an embodiment, the method is conducted using a dual ion exchange treatment, wherein a first molten salt bath comprises the sodium salt in an amount of greater than or equal to 8 weight % and less than or equal to 100 weight %, a lithium salt in an amount of greater than or equal to 0 weight % and less than or equal to 10 weight %, and a potassium salt in an amount of greater than or equal to 0 weight % and less than or equal to 90 weight %; and a second molten salt bath comprises the sodium salt in an amount of greater than or equal to 8 weight % and less than or equal to 100 weight %, a lithium salt in an amount of greater than or equal to 0 weight % and less than or equal to 10 weight %, and a potassium salt in an amount of greater than or equal to 0 weight % and less than or equal to 90 weight %. In each molten salt bath, the sodium salt may comprise sodium nitrate ($NaNO_3$), the lithium salt comprises lithium nitrate ($LiNO_3$), and the potassium salt comprises potassium nitrate ($KNO_3$).

The methods therein may be effective to form the glass-based substrate having a molar ratio of potassium oxide ($K_2O$) to sodium oxide ($Na_2O$) averaged over a distance from the surface to a depth of 0.4 micrometers that is greater than or equal to 0 and less than or equal to 1.8.

The methods herein may be effective to form the glass-based substrate having a spike depth of layer ($DOL_{spike}$) that is greater than or equal to 4 micrometers and less than or equal to 8 micrometers.

End Products

Figure 3A:
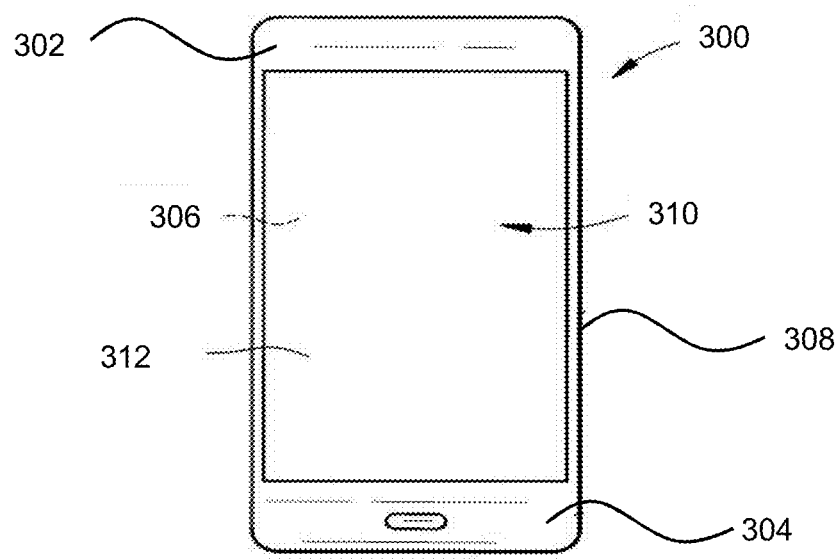
FIG. 3A is a plan view of an exemplary electronic device incorporating any of the glass articles disclosed herein.
Figure 3B:
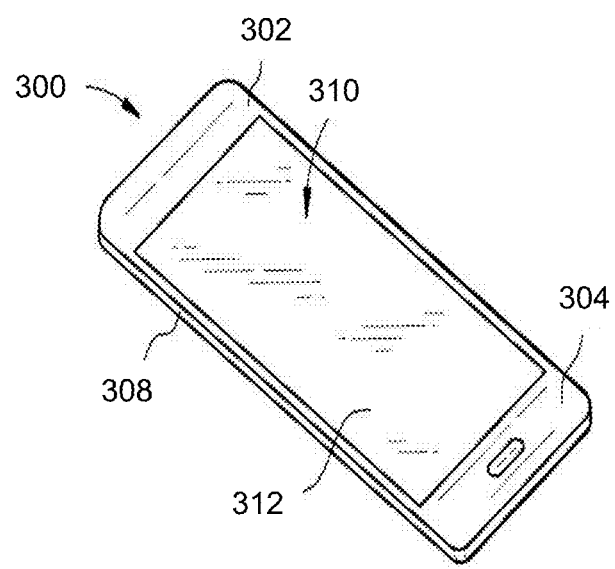
FIG. 3B is a perspective view of the exemplary electronic device of FIG. 3A.

The glass-based articles disclosed herein may be incorporated into another article such as an article with a display (or display articles) (e.g., consumer electronics, including mobile phones, tablets, computers, navigation systems, and the like), architectural articles, transportation articles (e.g., automobiles, trains, aircraft, sea craft, etc.), appliance articles, or any article that requires some transparency, scratch-resistance, abrasion resistance or a combination thereof. An exemplary article incorporating any of the glass articles disclosed herein is shown in FIGS. 3A and 3B. Specifically, FIGS. 3A and 3B show a consumer electronic device 300 including a housing 302 having front 304, back 306, and side surfaces 308; electrical components (not shown) that are at least partially inside or entirely within the housing and including at least a controller, a memory, and a display 310 at or adjacent to the front surface of the housing; and a cover 312 at or over the front surface of the housing such that it is over the display. In some embodiments, the cover 312 and/or housing 302 may include any of the glass articles disclosed herein.

EXAMPLES

Various embodiments will be further clarified by the following examples. In the Examples, prior to being strengthened, the Examples are referred to as "substrates". After being subjected to strengthening, the Examples are referred to as "articles" or "glass-based articles".

Glass substrates according to Compositions A-C were ion exchanged and the resulting articles tested.

Compositions A and B had the following compositions. Composition A: 17.83 mol % $Al_2O_3$, 6.11 mol % $B_2O_3$, 4.41 mol % MgO, 1.73 mol % $Na_2O$, 58.39 mol % $SiO_2$, 0.08 mol % $SnO_2$, 0.18 mol % $K_2O$, 0.02 mol % $Fe_2O_3$, 0.58 mol % CaO, and 10.66 mol % $Li_2O$ (0.00 mol % SrO, 0.00 mol % ZnO, and 0.00 mol % $P_2O_5$); and a $Na_2O/Li_2O$ molar ratio of 0.16. Composition B: 12.88 mol % $Al_2O_3$, 1.84 mol % $B_2O_3$, 2.86 mol % MgO, 2.39 mol % $Na_2O$, 70.96 mol % $SiO_2$, 0.07 mol % $SnO_2$, 0.02 mol % $Fe_2O_3$, 8.13 mol % $Li_2O$, and 0.85 mol % ZnO, (0.00 mol % $K_2O$, 0.00 mol % CaO, 0.00 mol % SrO, and 0.00 mol % $P_2O_5$); and a $Na_2O/Li_2O$ molar ratio of 0.29.

Composition C had the following composition. Composition C: 15.17 mol % $Al_2O_3$, 6.73 mol % $B_2O_3$, 1.02 mol % MgO, 4.32 mol % $Na_2O$, 63.27 mol % $SiO_2$, 0.03 mol % $SnO_2$, 0.02 mol % $Fe_2O_3$, 1.55 mol % CaO, 6.86 mol % $Li_2O$, and 1.03 mol % SrO, (0.00 mol % $K_2O$, and 0.00 mol % $P_2O_5$, 0.00 mol % ZnO); and a $Na_2O/Li_2O$ molar ratio of 0.63.

Several glass articles were prepared under varying ion exchange conditions, including 0 mol % sodium salt to 100 mol % sodium salt. Scratch testing of the glass articles of the examples was completed using a Bruker UMT (universal mechanical tester) with a Knoop geometry diamond tip from Gilmore Diamonds. The tip was loaded into a surface of the glass article at a rate of 0.14 N/s to a desired load of 5N or 8N, with two to five scratches per load, at which point the tip was dragged laterally through the article at a rate of 9.34 mm/min. From there, the diamond tip was unloaded at a rate of 0.14 N/s.

Examples 1-6 and Examples A-D
(Comparative)—Glass Articles Based on
Composition A—SIOX Glass articles were formed based on substrates according to Composition A, which were ion exchanged according to the bath conditions described in Table 1A.

TABLE 1A

| Example | t (mm) | Step1 $NaNO_3/KNO_3/LiNO_3$ (mol %) | Step 1 (° C.) | Step 1 time (hours) |
| --- | --- | --- | --- | --- |
| A Comparative | 0.8 | 0/100/0 | 450 | 7 |
| B Comparative | 0.8 | 6/94/0 | 450 | 8.4 |
| C Comparative | 0.8 | 7/93/0 | 450 | 8 |
| D Comparative | 0.8 | 7/93/0 | 450 | 12 |
| 1 | 0.8 | 11.8/86.2/2 | 450 | 8.4 |
| 2 | 0.8 | 100/0/0 | 450 | 1 |
| 3 | 0.8 | 9.8/88.2/2 | 450 | 8.4 |
| 4 | 0.75 | 10/88.8/1.2 | 450 | 8.4 |
| 5 | 0.75 | 12/86.2/1.8 | 450 | 8.4 |
| 6 | 0.8 | 30/70/0 | 450 | 8 |

Table 1B provides the scratch data.

TABLE 1B

| Example | 5N | 8N | Depth of Compression (DOC) |
|---|---|---|---|
| A Comparative | Lateral cracking present | Article fractured | — |
| B Comparative | Lateral cracking present | Lateral cracking present | 175 micrometers (21.9% of thickness) |
| C Comparative | — | — | — |
| D Comparative | Lateral cracking present | Lateral cracking present | — |
| 1 | NO cracking | Some Lateral cracking present | 176 micrometers (22.0% of thickness) |
| 2 | NO cracking | NO cracking | — |
| 3 | NO cracking | NO cracking | 169 micrometers (21.1% of thickness) |
| 4 | NO cracking | NO cracking | — |
| 5 | — | — | — |
| 6 | NO cracking | Some lateral cracking | — |

Example A (comparative) of Table 1B shows that at 5N, lateral cracking appeared on the glass article when no sodium was present in the ion exchange bath. Increasing the load to 8N resulted in fracturing of the article. As sodium concentration of the ion exchange bath increased, the threshold at which lateral cracking formed was increased. While Example B (comparative) having a bath of 6% Na/94% K showed lateral cracking at 5N, the article did not break when loaded to 8N. Example 1 having a condition of 12% Na further increased the threshold—no lateral cracking was observed at 5N—however some lateral cracking, fewer instances relative to Example B, occurred at 8N. For Example 6, where the bath concentration was increased to 30% Na, no lateral cracking was observed at 5N—however some lateral cracking occurred at 8N. For Example 2, where the bath concentration was increased to 100% Na, no lateral cracking was observed at 5N or 8N. The articles of Examples 2 and 6 were, however, frangible. At a nominal 10% NaNO$_3$ concentration similar behavior between 0.75 mm (Example 4) and 0.8 mm (Example 3) thickness is observed.

FIGS. 4-8 provide GDOES elemental profiles of oxide molar concentration as a function of depth in the glass article from a first surface (0 micrometers) for Examples 1, C, D, 4, and 6, respectively.

Figure 4:
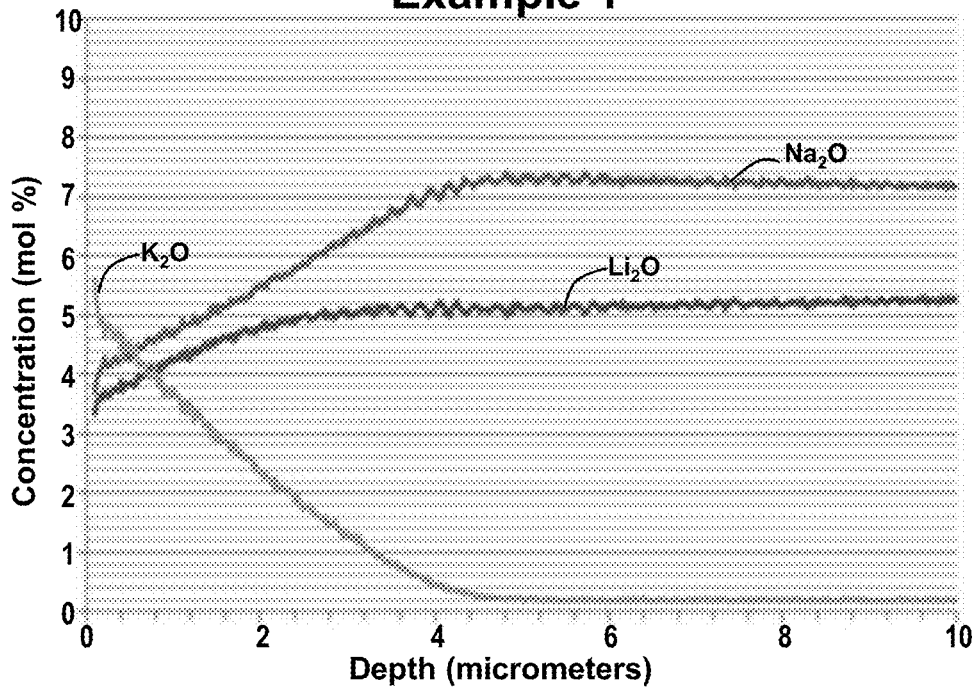
FIG. 4 is a graph of oxide molar concentration as a function of depth in the glass article from a first surface (0 micrometers) for an embodiment.

For Example 1 of FIG. 4, the averages under the curve of measured concentration values over the distance from 0 micrometers to 0.4 micrometers were: 4.1 for Na$_2$O mol % and 4.82 for K$_2$O mol %. The resulting molar ratio of potassium oxide (K$_2$O) to sodium oxide (Na$_2$O) was 1.16. The depth of layer of potassium (DOL$_K$) was 4.7 micrometers.

Figure 5:
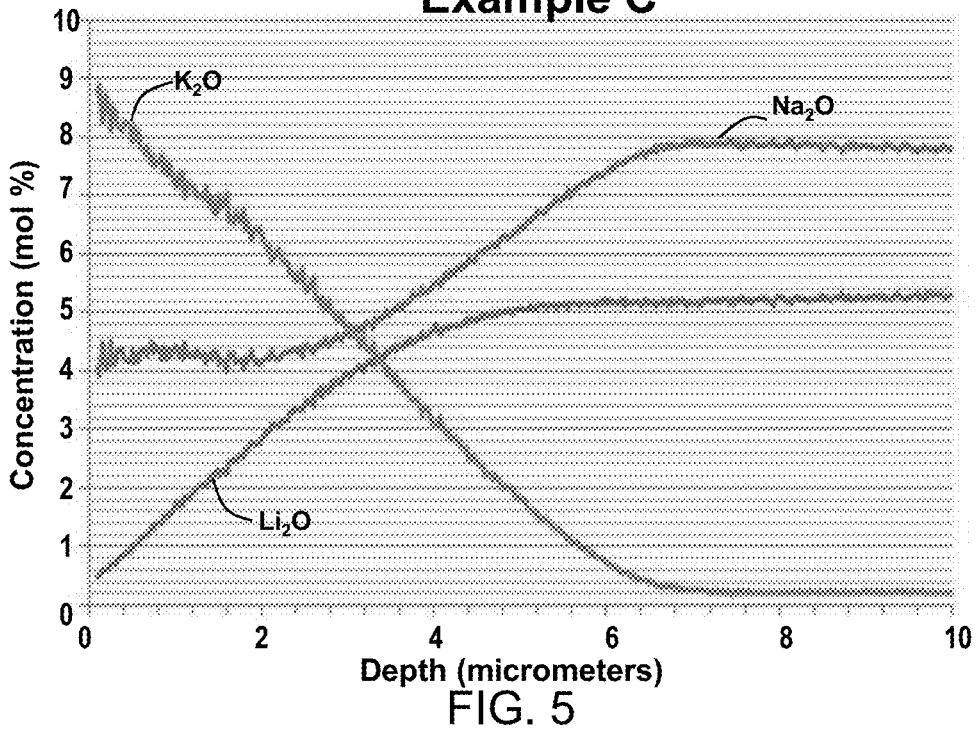
FIG. 5 is a graph of oxide molar concentration as a function of depth in the glass article from a first surface (0 micrometers) for a comparative example.

For Example C (comparative) of FIG. 5, the averages under the curve of measured concentration values over the distance from 0 micrometers to 0.4 micrometers were: 4.2 for Na$_2$O mol % and 8.4 for K$_2$O mol %. The resulting molar ratio of potassium oxide (K$_2$O) to sodium oxide (Na$_2$O) was 2.0. The depth of layer of potassium (DOL$_K$) was 7.2 micrometers.

Figure 6:
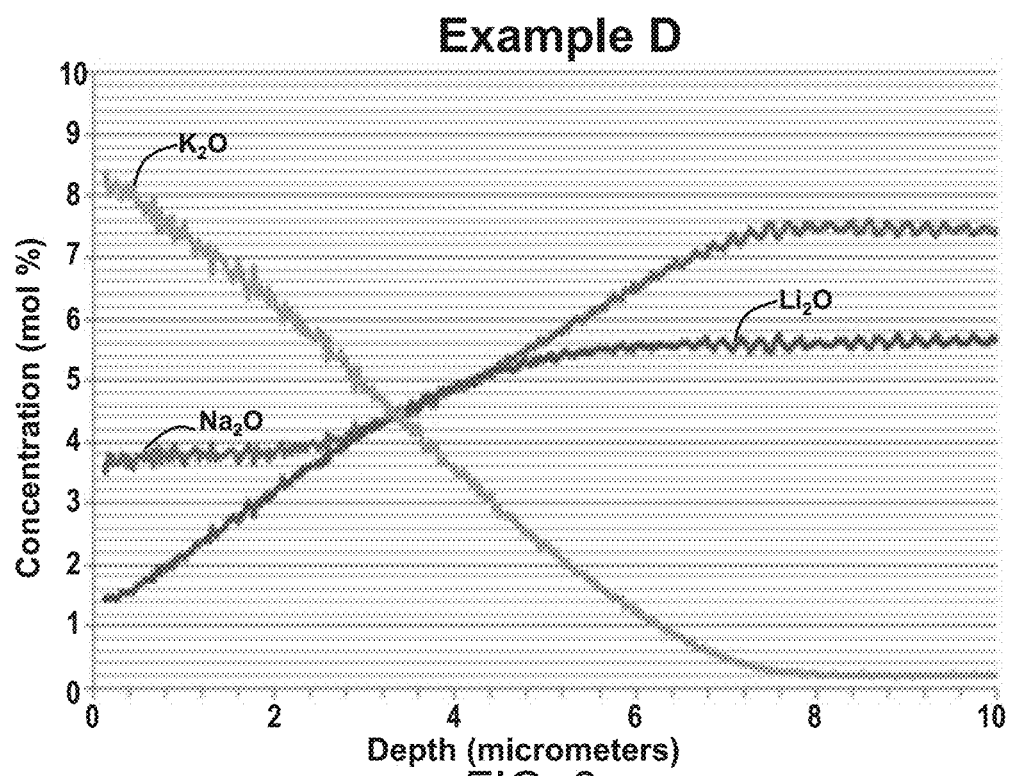
FIG. 6 is a graph of oxide molar concentration as a function of depth in the glass article from a first surface (0 micrometers) for a comparative example.

For Example D (comparative) of FIG. 6, the averages under the curve of measured concentration values over the distance from 0 micrometers to 0.4 micrometers were: 3.7 Na$_2$O mol % and 8.1 for K$_2$O mol %. The resulting molar ratio of potassium oxide (K$_2$O) to sodium oxide (Na$_2$O) was 2.21. The depth of layer of potassium (DOL$_K$) was 7.9 micrometers.

Figure 7:
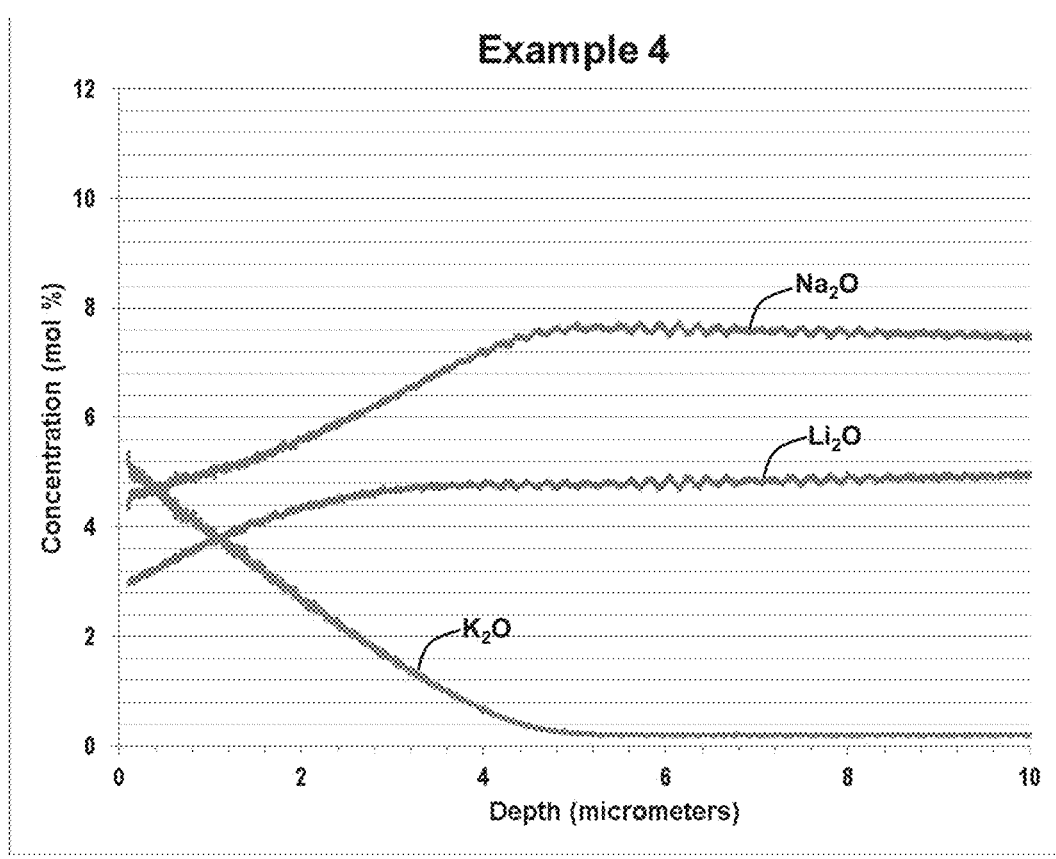
FIG. 7 is a graph of oxide molar concentration as a function of depth in the glass article from a first surface (0 micrometers) for an embodiment.

For Example 4 of FIG. 7, taking the average under the curve of measured concentration values over the distance from 0 micrometers to 0.4 micrometers, the average Na$_2$O mol % was 4.64 and the average K$_2$O mol % was 4.88. The resulting molar ratio of potassium oxide (K$_2$O) to sodium oxide (Na$_2$O) was 1.05. The depth of layer of potassium (DOL$_K$) was 5.0 micrometers.

Figure 8:
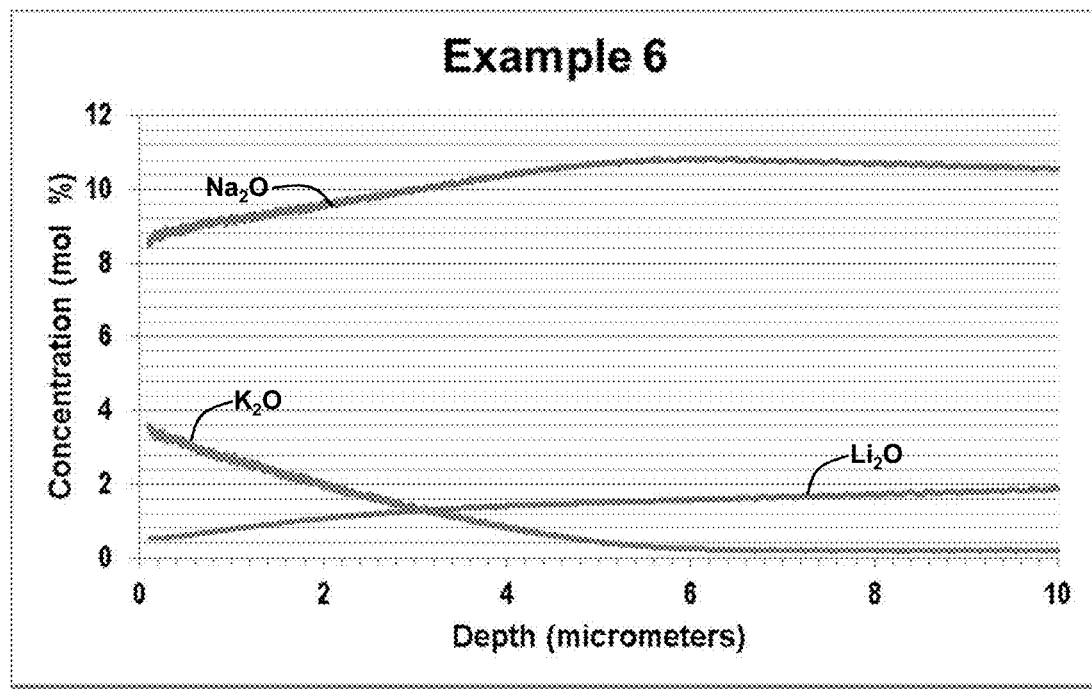
FIG. 8 is a graph of oxide molar concentration as a function of depth in the glass article from a first surface (0 micrometers) for an embodiment.

For Example 6 of FIG. 8, taking the average under the curve of measured concentration values over the distance from 0 micrometers to 0.4 micrometers, the average Na$_2$O mol % was 8.78 and the average K$_2$O mol % was 3.31. The resulting molar ratio of potassium oxide (K$_2$O) to sodium oxide (Na$_2$O) was 0.38. The depth of layer of potassium (DOL$_K$) was 6.2 micrometers.

The scratch resistance of Example 1, where the average K$_2$O to Na$_2$O molar ratio over the distance from 0 micrometers to 0.4 micrometers was 1.25 was better than that of Examples C and D, where the ratio was 2.0 and 2.27 respectively. Both Examples 4 and 6, with ratios of 1.05 and 0.38, respectively, displayed excellent scratch resistance.

From this, it is generally concluded that stress profiles advantageous for scratch resistance have a Na$_2$O mol % at or near the surface that is similar to or within a couple of mol % relative to the K$_2$O mol %. Moreover, preferred average K$_2$O to Na$_2$O molar ratio over the distance from 0 micrometers to 0.4 micrometers are greater than or equal to 0 to less than or equal to 1.8, including all values and ranges therebetween.

Figure 9:
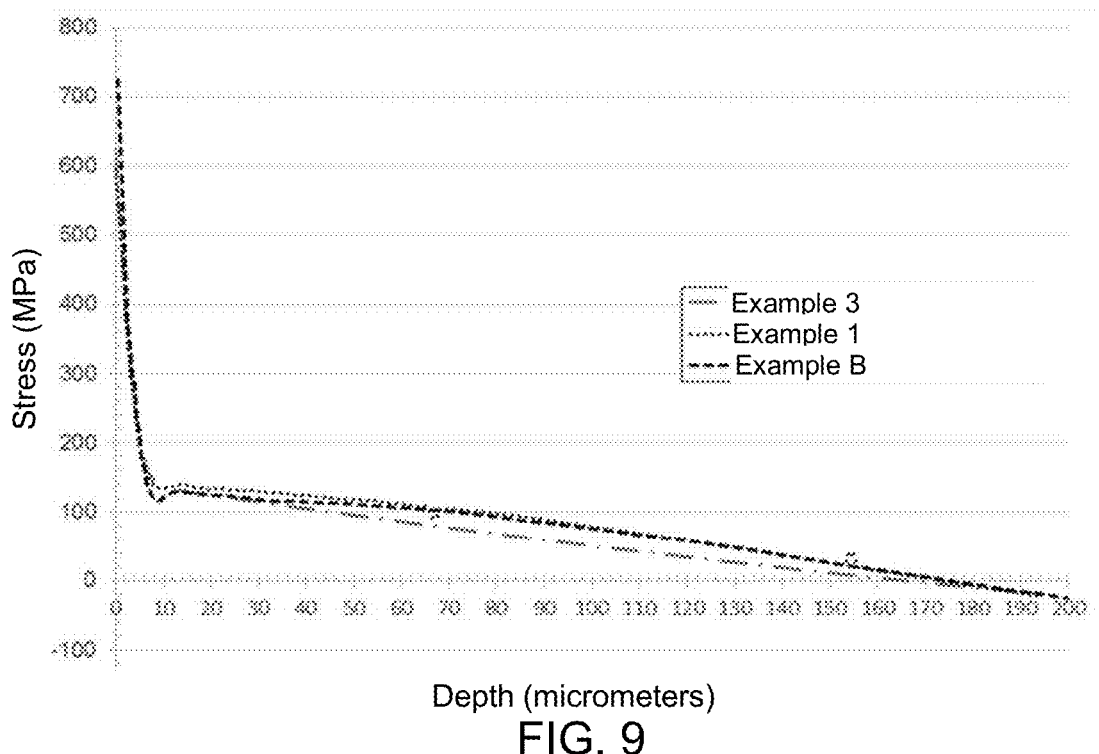
FIG. 9 is a graph of stress (MPa) versus position (micrometers) from a surface for embodiments of a glass-based article and a comparative example.

FIG. 9 is a graph of stress (MPa) versus position (micrometers) from a surface for Examples 1, 3, and B all of the same thickness. Although similar compressive stresses at depths between 10-30 micrometers depth are shown for the two inventive and one comparative articles, Example 1, having higher Na mol % in the salt bath has a significantly increased load for onset of lateral cracking as compared to Example B as noted in Table 1B.

For Examples 1 and 3, both shown FIG. 9, average compressive stresses over the depth of 15 micrometers to 40 micrometers based on the average area under the curve in FIG. 9 were both 140 MPa. Example 1 had a depth of layer (DOL$_{spike}$) of 5.1 micrometers and a CS$_{knee}$ of 138 MPa. Example 3 had a depth of layer (DOL$_{spike}$) of 5.3 micrometers and a CS$_{knee}$ of 141 MPa.

Figure 10:
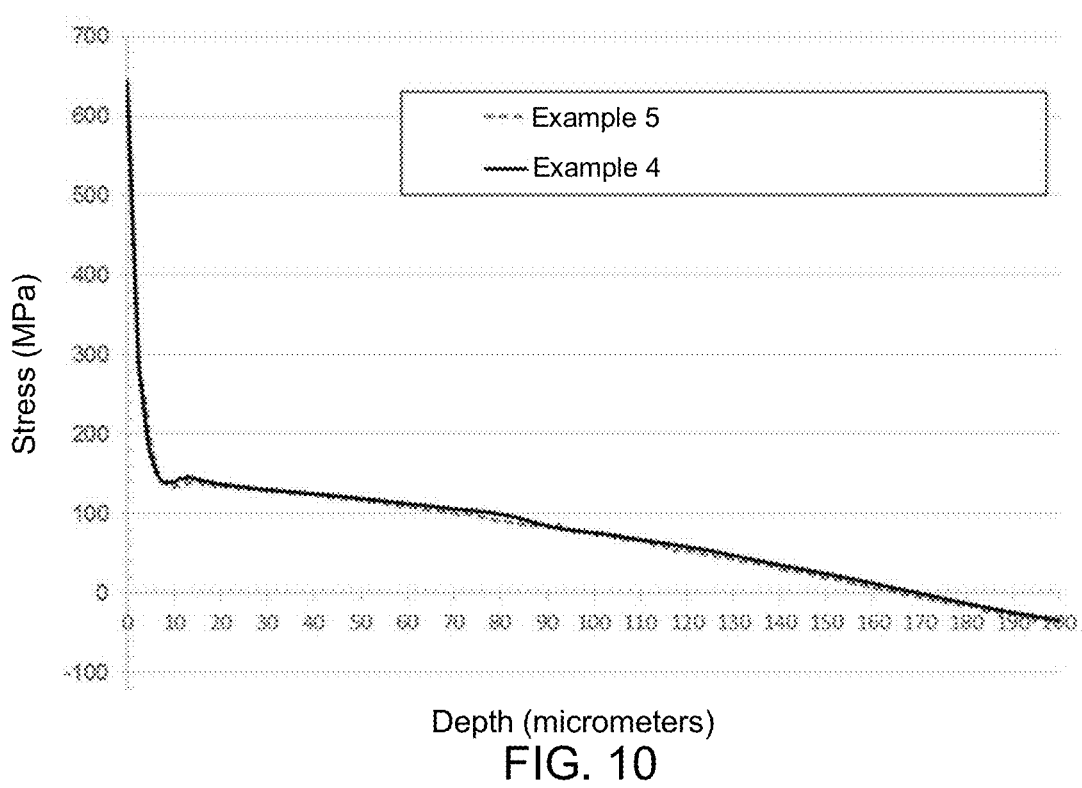
FIG. 10 is a graph of stress (MPa) versus position (micrometers) from a surface for embodiments of a glass-based article.

FIG. 10 is a graph of stress (MPa) versus position (micrometers) from a surface for Examples 4-5. Example 4, which used 10% NaNO$_3$/1.2% LiNO$_3$, resulted in a stress profile having about 40 MPa higher surface CS, which can be beneficial for overstress failures.

Examples 7-8 and Example E
(Comparative)—Glass Articles Based on
Composition B—SIOX Glass articles were formed based on substrates according to Composition B, which were ion exchanged according to the bath conditions described in Table 2A.

TABLE 2A

| Example | t (mm) | Step1 NaNO$_3$/KNO$_3$/ LiNO$_3$ (mol %) | Step 1 (° C.) | Step 1 time (hours) |
|---|---|---|---|---|
| E Comparative | 0.8 | 6.5/93.5/0 | 430 | 4.5 |
| 7 | 0.8 | 12/86/2 | 430 | 4.5 |
| 8 | 0.8 | 100/0/0 | 430 | 0.75 |

Table 2B provides the scratch data.

TABLE 2B

| Example | 5N | 8N | Depth of Compression (DOC) |
|---|---|---|---|
| E Comparative | Lateral cracking present | Lateral cracking present | — |
| 7 | NO cracking | Lateral cracking present | 180 micrometers (22.5% of thickness) |
| 8 | NO cracking | NO cracking | — |

Example E (comparative) of Table 2B shows that at both 5N and 8N, lateral cracking appeared on the glass article when there was low sodium present in the ion exchange bath. As sodium concentration of the ion exchange bath increased, the threshold at which lateral cracking formed was increased. Example 7 having a condition of 12% Na further increased the threshold—no lateral cracking was observed at 5N—however there was lateral cracking at 8N. Example 8, where the bath concentration was increased to 100% Na, no lateral cracking was observed at 5N or 8N.

Figure 11:
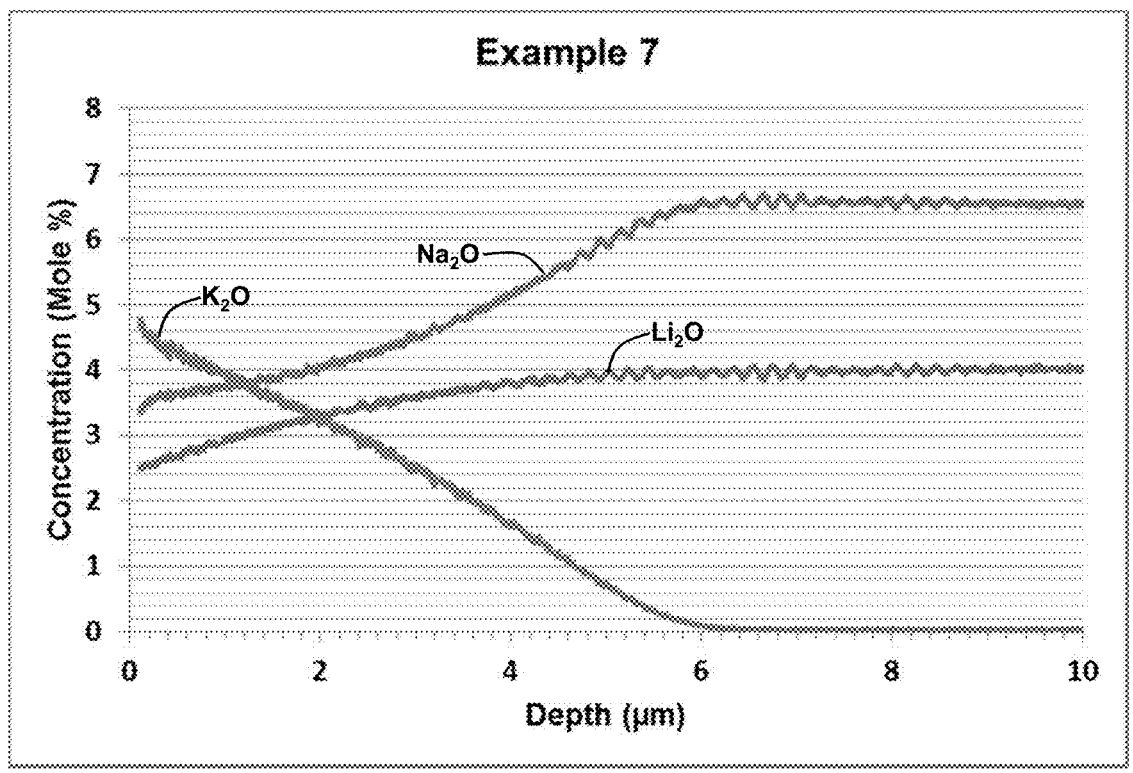
FIG. 11 is a graph of oxide molar concentration as a function of depth in the glass article from a first surface (0 micrometers) for an embodiment.

For Example 7 of FIG. 11, taking the average under the curve of measured concentration values over the distance from 0 micrometers to 0.4 micrometers, the average Na$_2$O mol % was 3.55 and the average K$_2$O mol % was 4.47. The resulting molar ratio of potassium oxide (K$_2$O) to sodium oxide (Na$_2$O) was 1.26. The depth of layer of potassium (DOL$_K$) was 6.1 micrometers.

Figure 12:
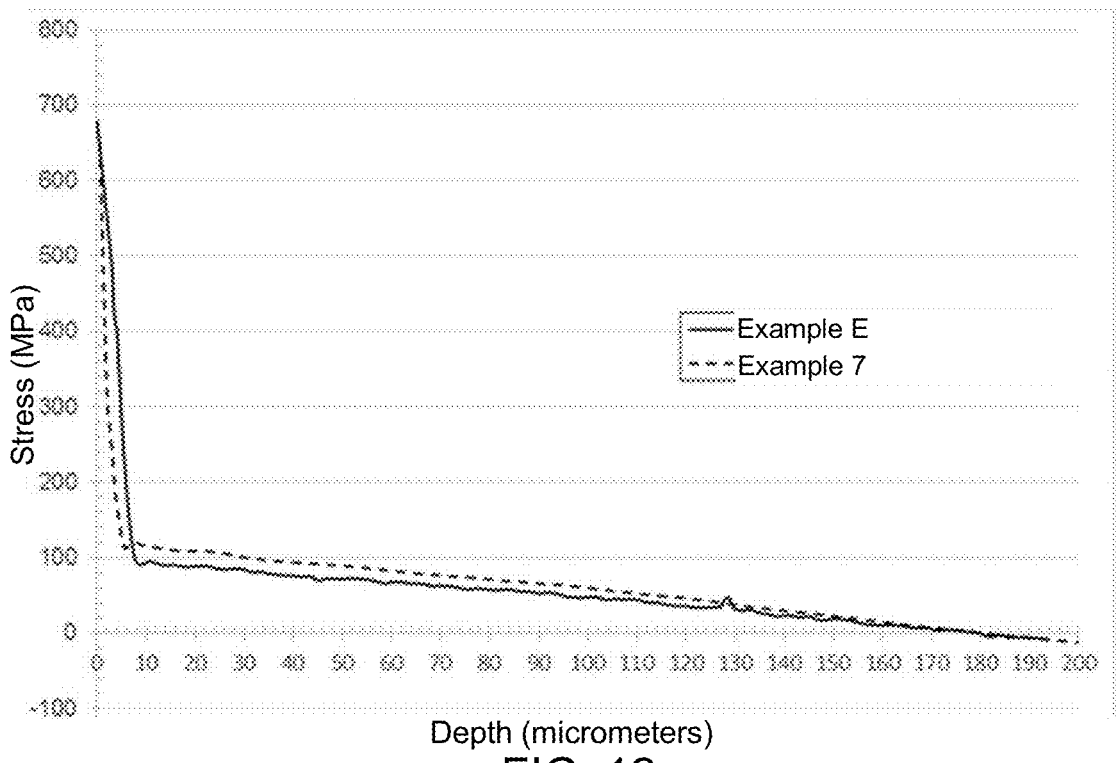
FIG. 12 is a graph of stress (MPa) versus position (micrometers) from a surface for embodiments of a glass-based article.

FIG. 12 is a graph of stress (MPa) versus position (micrometers) from a surface for Examples 7 and E. CS$_{knee}$ for Example 7 (116 MPa) improved by ~16 MPa relative to the CS$_{knee}$ for Comparative Example E (~100 MPa).

For Example 7, shown in FIG. 12, an average compressive stress over the depth of 15 micrometers to 40 micrometers based on the average area under the curve in FIG. 12 was 102 MPa. Example 7 had a depth of layer (DOL$_{spike}$) of 6.5 micrometers and a CS$_{knee}$ of 116 MPa.

Example F (Comparative)—Glass Article Based on Composition C—DIOX

Glass articles were formed based on substrates according to Composition C, which were ion exchanged according to the bath conditions described in Table 3A.

Table 3B provides the scratch data.

TABLE 3B

| Example | 5N | 8N | Depth of Compression (DOC) |
|---|---|---|---|
| F Comparative | NO cracking | NO cracking | 176.5 micrometers (22.1% of thickness) |

Figure 13:
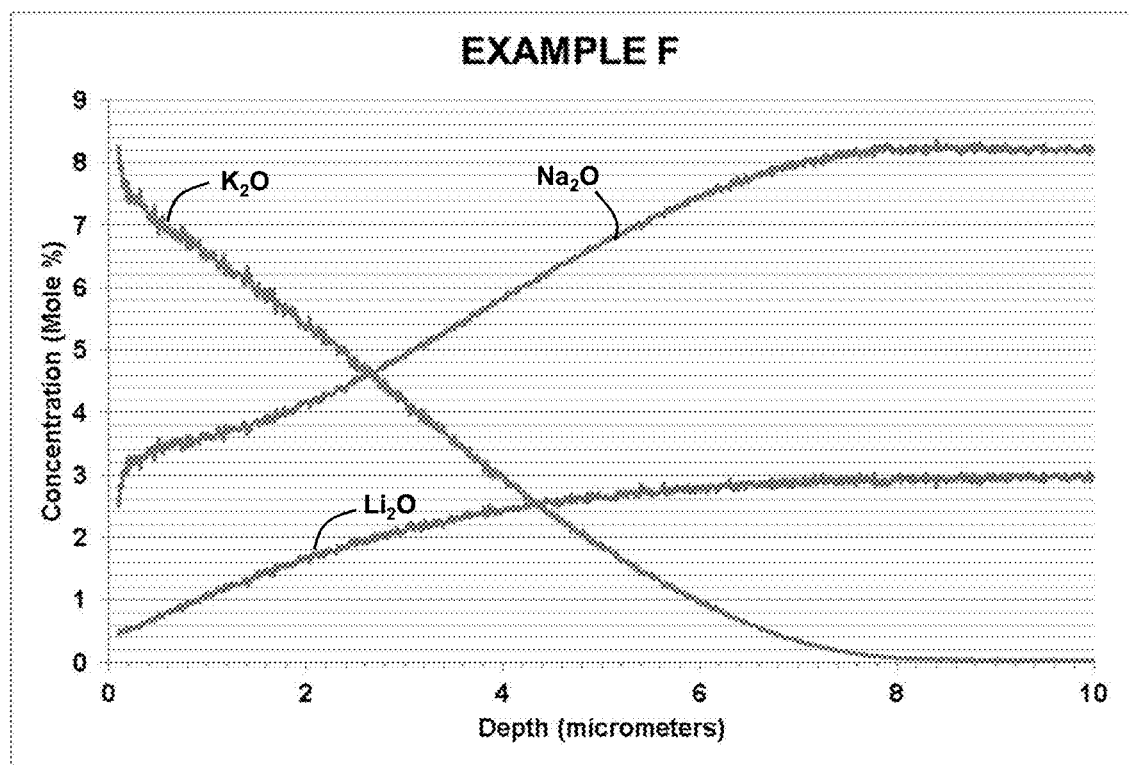
FIG. 13 is a graph of oxide molar concentration as a function of depth in the glass article from a first surface (0 micrometers) for a comparative example.

FIG. 13 provides a GDOES elemental profile of oxide molar concentration as a function of depth in the glass article from a first surface (0 micrometers) for Example F (comparative). Taking the average under the curve of measured concentration values over the distance from 0 micrometers to 0.4 micrometers, the average Na$_2$O mol % was 3.15 and the average K$_2$O mol % was 7.5. The resulting molar ratio of potassium oxide (K$_2$O) to sodium oxide (Na$_2$O) was 2.37.

Figure 14:
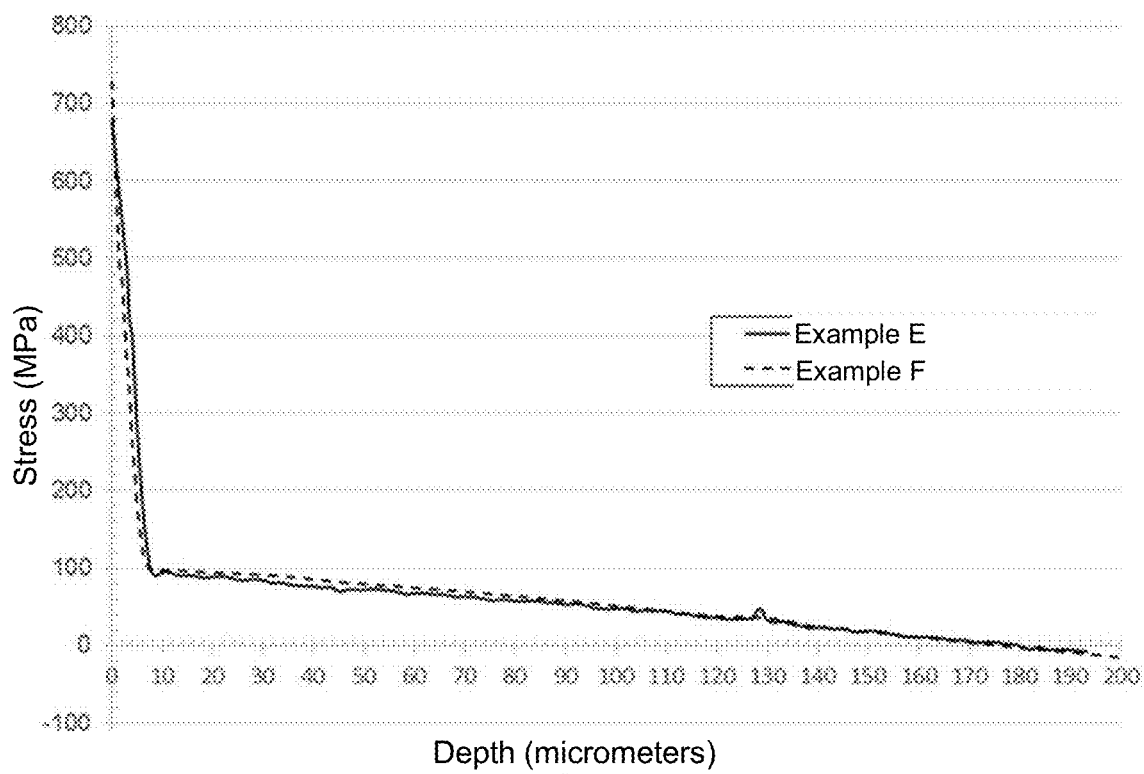
FIG. 14 is a graph of stress (MPa) versus position (micrometers) from a surface for comparative glass-based articles.

FIG. 14 is a graph of stress (MPa) versus position (micrometers) from a surface for Examples E and F. In the center of the glass, Example E (comparative) had a Na$_2$O/Li$_2$O mole ratio of 0.29, whereas Example F (comparative) had a Na$_2$O/Li$_2$O mole ratio of 0.63. The two glass compositions had comparable stress profiles.

Example F (comparative) of Table 3B shows that at both 5N and 8N, there was no lateral cracking upon DIOX treatment. In Example E (comparative) of Table 2B, at both 5N and 8N, lateral cracking appeared on the glass article when there was low sodium present in the ion exchange bath. Scratch performance was improved (no lateral cracking observed at 8N) for the similar stress profiles (FIG. 14) when the glass composition had a 0.63 Na$_2$O/Li$_2$O mole ratio in the center of the glass (Example F) vs 0.29 (Example E). At 0.63 Na$_2$O/Li$_2$O mole ratio, IOX of the K+ in the salt with Li in the glass is low, and K+ is ion exchanging with Na in glass, while Na+ in the salt is ion exchanging with Li in the glass. Thus the glass molar volume in the surface layer was not significantly decreased by ion exchanging a large K ion for the small Na ion and embrittling the surface.

For Example F (comparative), shown in FIG. 14, an average compressive stress over the depth of 15 micrometers to 40 micrometers based on the average area under the curve in FIG. 14 was 92 MPa. Example F had a depth of layer (DOL$_{spike}$) of 8.1 micrometers and a CS$_{knee}$ of 109 MPa.

Examples 9-10—Glass Articles Based on Composition A—DIOX

Glass articles were formed based on substrates according to Composition A, which were ion exchanged according to the bath conditions described in Table 4A.

TABLE 3A

| Example | t (mm) | Step 1 NaNO$_3$/KNO$_3$/LiNO$_3$ (mol %) | Step 1 (° C.) | Step 1 time (hours) | Step 2 NaNO$_3$/KNO$_3$/LiNO$_3$ (mol %) | Step 2 (° C.) | Step 2 time (hours) |
|---|---|---|---|---|---|---|---|
| F Comparative | 0.8 | 15/85/0 | 430 | 6 | 4/96/0 | 430 | 1.25 |

TABLE 4A

| Example | t (mm) | Step 1 NaNO$_3$/KNO$_3$/LiNO$_3$ (mol %) | Step 1 (° C.) | Step 1 time (hours) | Step 2 NaNO$_3$/KNO$_3$/LiNO$_3$ (mol %) | Step 2 (° C.) | Step 2 time (hours) |
|---|---|---|---|---|---|---|---|
| 9 | 0.8 | 15.0/81.0/4.0 + 0.5% Silicic Acid | 450 | 8 | 15.0/85.0/0 | 450 | 0.5 |
| 10 | 0.8 | 11.5/84.7/3. | 450 | 13 | 15.0/85.0/0 | 450 | 0.5 |

Table 4B provides the scratch data.

TABLE 4B

| Example | 5N | 8N | Depth of Compression (DOC) |
|---|---|---|---|
| 9 Sample 1 | NO cracking | Lateral cracking present Large cracking$^A$ 2 of 5 scratches Max. Width: 585.4 μm and 632.6 μm | 157 micrometers (19.6% of thickness) |
| 9 Sample 2 | NO cracking | Lateral cracking present Large cracking$^A$ 2 of 5 scratches Max. Width: 513.2 μm and 484.4 μm | — |
| 10 Sample 1 | NO cracking | Lateral cracking present Large cracking$^A$ 1 of 5 scratches Max. Width: 467.3 μm | 170.5 micrometers (21.3% of thickness) |
| 10 Sample 2 | NO cracking | Lateral cracking present Large cracking$^A$ 4 of 5 scratches Max. Width: 454.9 μm, 587.5 μm, 622.2 μm, 577.9 μm | — |

A = cracks measuring larger than 150 μm

As shown in for Examples 9-10 of Table 4B, scratch performance using high Na (15%) DIOX to achieve high surface CS (FIG. 15) maintained scratch performance with no lateral cracking at 5N. Both DIOX conditions have a first step in high Na salt (e.g., >10% NaNO$_3$), with 1st step having sufficient % Li to control frangibility while achieving deep depth of compression, and 2nd step in high Na salt without Li, with short time to build a high CS spike on the surface. Using this DIOX approach, it is feasible to achieve CS between about 700-800 MPa while still having no lateral cracking in Li containing glass compositions with Na$_2$O/Li$_2$O mole ratio of <0.63.

Figure 15:
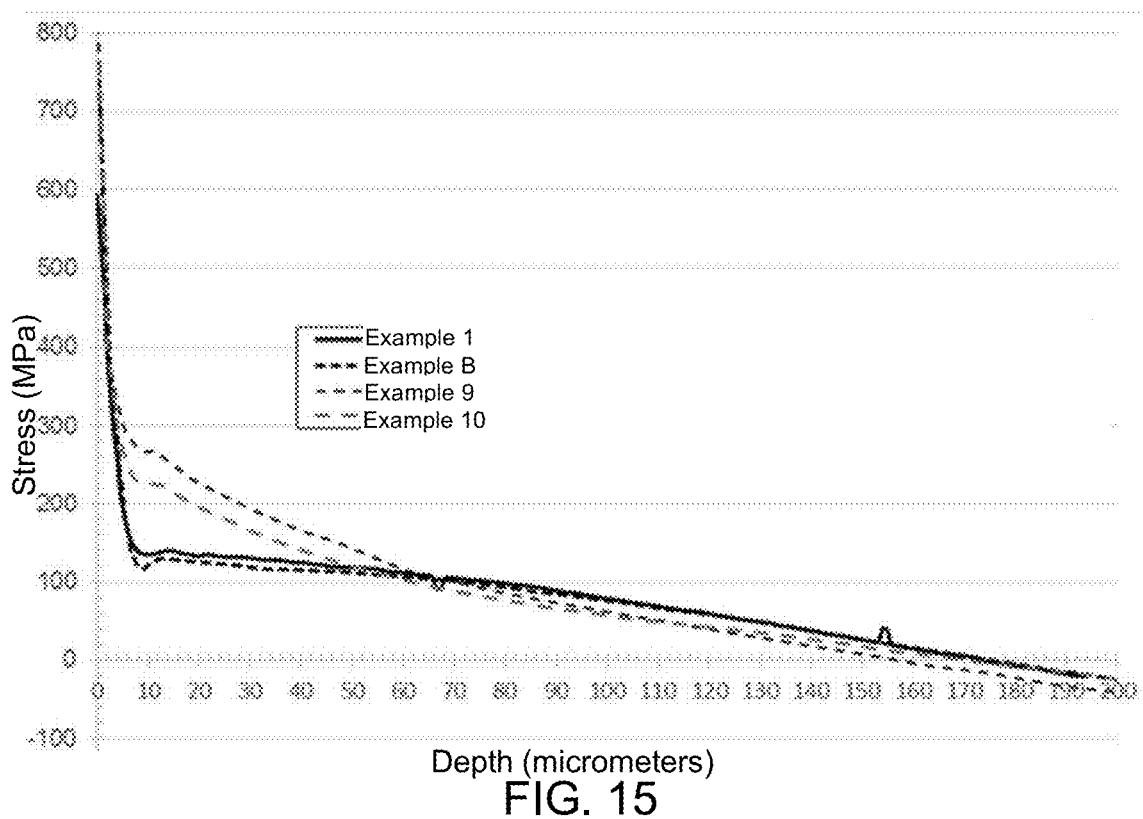
FIG. 15 is a graph of stress (MPa) versus position (micrometers) from a surface for embodiments of a glass-based article and a comparative example.

FIG. 15 is a graph of stress (MPa) versus position (micrometers) from a surface for Examples 1, 9-10, and B (comparative). Examples 9-10, which utilized DIOX, resulted in stress profiles that have high surface compressive stress (CS) with good scratch performance as measured by no lateral cracking at 5N (Table 4B). The DIOX stress profiles of Examples 9-10 also have higher knee stresses as compared to the SIOX stress profiles of Example B (comparative), which had lateral cracking at 5N (6% Na with surface CS of 725 MPa), and of Example 1, which had no lateral cracking at 5N (12% Na 2% Li, with surface CS of 603 MPa).

For Examples 9-10, both shown in FIG. 15, average compressive stresses over the depth of 15 micrometers to 40 micrometers based on the average area under the curve in FIG. 15 were, respectively: 203 MPa and 174 MPa. Example 9 had a depth of layer (DOL$_{spike}$) of 4.4 micrometers and a CS$_{knee}$ of 280 MPa. Example 10 had a depth of layer (DOL$_{spike}$) of 5.2 micrometers and a CS$_{knee}$ of 233 MPa.

Examples G-I (Comparative)—Glass Articles Based on Composition A—DIOX

Glass articles were formed based on substrates according to Composition A, which were ion exchanged according to the bath conditions described in Table 5A.

TABLE 5A

| Example | t (mm) | Step 1 NaNO$_3$/KNO$_3$/LiNO$_3$ (mol %) | Step 1 (° C.) | Step 1 time (hours) | Step 2 NaNO$_3$/KNO$_3$/LiNO$_3$ (mol %) | Step 2 (° C.) | Step 2 time (hours) |
|---|---|---|---|---|---|---|---|
| G Comparative | 0.8 | 15.0/85.0/0 | 450 | 4 | 5.0/95.0/0 | 450 | 2 |
| H Comparative | 0.8 | 5.0/95.0/0 | 450 | 4 | 15.0/85.0/0 | 450 | 2 |

Table 5B provides the scratch data.

TABLE 5B

| Example | 5N | 8N | Depth of Compression (DOC) |
|---|---|---|---|
| G Comparative | Lateral cracking present | Lateral cracking present | 179 micrometers (22.4% of thickness) |
| H Comparative | Lateral cracking present | Lateral cracking present | — |

As shown in Table 5B, for Example G (comparative) using high Na (15%) in a 1st DIOX step followed by a second step of extended time (>30 minutes) in low Na salt (<10% NaNO$_3$), with no Li resulted in lateral cracking at 5N for a glass with Na$_2$O/Li$_2$O mole ratio of <0.63. Likewise, for Example H (comparative) using low Na (5%) in a 1st DIOX step followed by a second step of high Na salt (15% NaNO$_3$), with no Li also resulted in lateral cracking at 5N for a glass with Na$_2$O/Li$_2$O mole ratio of <0.63.

Figure 16:
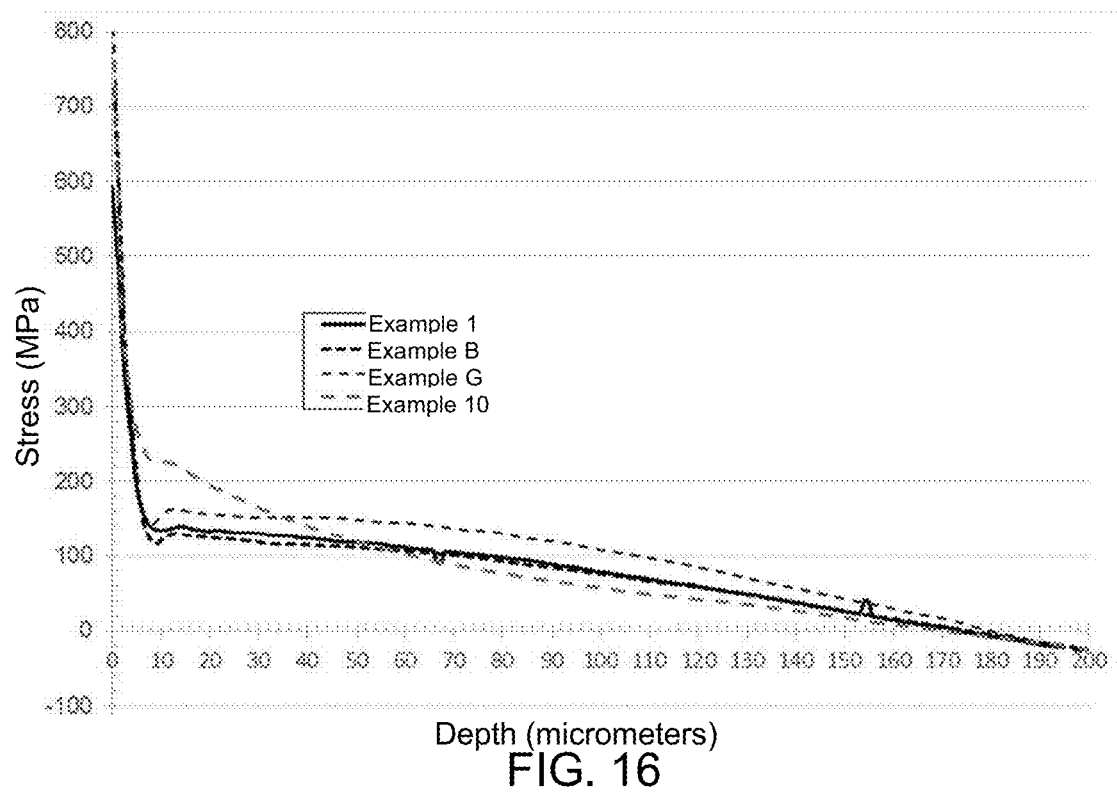
FIG. 16 is a graph of stress (MPa) versus position (micrometers) from a surface for embodiments of a glass-based article and comparative examples.

FIG. 16 is a graph of stress (MPa) versus position (micrometers) from a surface for Examples 1 and 10; and B and G (comparatives). Example G (comparative) and Example 10 were DIOX-treated and resulted in stress profiles having high surface CS. Example G (comparative) had poor scratch performance, and Example 10 had good scratch performance as measured by no lateral cracking in 5N. Example G (comparative) stress profile had a surface CS of 828 MPa, and Example 10 had a surface CS of 726 MPa. In FIG. 16, the stress profiles are compared to the SIOX stress profiles of Example B (comparative), which had lateral cracking at 5N (6% Na with surface CS of 725 MPa), and of Example 1, which had no lateral cracking at 5N (12% Na 2% Li, with surface CS of 603 MPa).

All compositional components, relationships, and ratios described in this specification are provided in mol % unless otherwise stated. All ranges disclosed in this specification include any and all ranges and subranges encompassed by the broadly disclosed ranges whether or not explicitly stated before or after a range is disclosed.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

What is claimed is:

1. A glass-based article comprising:
    sodium having a non-zero varying concentration extending from a surface of the glass-based article to a depth of the glass-based article;
    a compressive layer extending from the surface to a spike depth of layer (DOL$_{spike}$) from 4 micrometers to 8 micrometers; and
    a molar ratio of potassium oxide (K$_2$O) to sodium oxide (Na$_2$O) averaged over a distance from the surface to a depth of the glass-based article of 0.4 micrometers that is from 0.6 to 1.6.

2. The glass-based article of claim 1, wherein the glass-based article comprises an average compressive stress (CS$_{avg}$) of greater than or equal to 115 MPa over a depth from 15 micrometers to 40 micrometers.

3. The glass-based article of claim 1, wherein the glass-based article comprises a depth of compression (DOC) that is greater than or equal to 0.19t.

4. The glass-based article of claim 1, wherein the glass-based article comprises a depth of compression (DOC) that is greater than or equal to 150 micrometers.

5. The glass-based article of claim 1, wherein the glass-based article comprises a Knoop scratch initiation threshold of greater than or equal to 5 N.

6. The glass-based article of claim 1, wherein the glass-based article comprises compressive stress at a knee (CS$_{knee}$) of greater than or equal to 115 MPa, and the DOL$_{spike}$ is greater than or equal to 4.4 micrometers.

7. The glass-based article of claim 1, wherein the glass-based article comprises compressive stress at a knee (CS$_{knee}$) of greater than or equal to 135 MPa, and the DOL$_{spike}$ is greater than or equal to 5 micrometers.

8. The glass-based article of claim 1, wherein the glass-based article has a maximum compressive stress (CS$_{max}$) of greater than or equal to 500 MPa.

9. The glass-based article of claim 1, wherein at a center of the glass-based article a molar ratio of sodium oxide (Na$_2$O) to lithium oxide (Li$_2$O) is less than or equal to 0.63.

10. The glass-based article of claim 9, wherein at the center of the glass-based article the molar ratio of sodium oxide (Na$_2$O) to lithium oxide (Li$_2$O) is greater than or equal to 0.10.

11. The glass-based article of claim 1, wherein a center of the glass-based article comprises: 9.39-25 mol % alumina (Al$_2$O$_3$), 0.1-20 mol % sodium oxide (Na$_2$O), and up to 9.01 mol % boron oxide (B$_2$O$_3$), and at least one alkaline earth metal oxide, wherein 15 mol %≤(R$_2$O+R'O−Al$_2$O$_3$−ZrO$_2$)−B$_2$O$_3$≤2 mol %, where R is Na and optionally one or more of Li, K, Rb, and Cs, and R' is one or more of Mg, Ca, Sr, and Ba.

12. The glass-based article of claim 1, comprising a lithium aluminosilicate composition.

13. The glass-based article of claim 1, wherein the molar ratio of potassium oxide (K$_2$O) to sodium oxide (Na$_2$O) is 0.8 to 1.4.

14. The glass-based article of claim 1, wherein the molar ratio of potassium oxide (K$_2$O) to sodium oxide (Na$_2$O) is 1 to 1.3.

15. The glass-based article of claim 1, comprising a potassium depth of layer (DOL$_K$) of 4 to 8 micrometers.

16. The glass-based article of claim 1, comprising a potassium depth of layer (DOL$_K$) of 5 to 7 micrometers.

17. The glass-based article of claim 1, exhibiting an amorphous microstructure that is substantially free of crystals or crystallites.

18. The glass-based article of claim 1, comprising a thickness of 0.5 mm to 0.8 mm.

19. A consumer electronic product comprising:
    a housing having a front surface, a back surface, and side surfaces;
    electrical components provided at least partially within the housing, the electrical components including at least a controller, a memory, and a display, the display being provided at or adjacent the front surface of the housing; and
    a cover disposed over the display,
    wherein at least a portion of at least one of the housing and cover comprises the glass-based article of claim 1.

* * * * *